(12) United States Patent
Forrest et al.

(10) Patent No.: US 8,535,759 B2
(45) Date of Patent: *Sep. 17, 2013

(54) METHOD AND APPARATUS FOR DEPOSITING MATERIAL USING A DYNAMIC PRESSURE

(75) Inventors: Stephen R. Forrest, Ann Arbor, MI (US); Max Shtein, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 225 days.

This patent is subject to a terminal disclaimer.

(21) Appl. No.: 12/823,323

(22) Filed: Jun. 25, 2010

(65) Prior Publication Data

US 2011/0045196 A1    Feb. 24, 2011

Related U.S. Application Data

(60) Continuation-in-part of application No. 10/690,704, filed on Oct. 23, 2003, now Pat. No. 7,744,957, and a continuation-in-part of application No. 12/786,982, filed on May 25, 2010, now Pat. No. 7,897,210, which is a continuation of application No. 12/175,641, filed on Jul. 18, 2008, now Pat. No. 7,722,927, which is a division of application No. 10/422,269, filed on Apr. 23, 2003, now Pat. No. 7,404,862, which is a continuation-in-part of application No. 10/233,470, filed on Sep. 4, 2002, now Pat. No. 7,431,968.

(60) Provisional application No. 60/317,215, filed on Sep. 4, 2001, provisional application No. 60/316,264, filed on Sep. 4, 2001, provisional application No. 60/316,968, filed on Sep. 5, 2001, provisional application No. 60/332,090, filed on Nov. 21, 2001.

(51) Int. Cl.
*C23C 16/00* (2006.01)
*B05D 5/06* (2006.01)

(52) U.S. Cl.
USPC ............. 427/249.1; 427/69; 427/70; 427/256

(58) Field of Classification Search
USPC ....................................... 427/248.1
See application file for complete search history.

(56) References Cited

U.S. PATENT DOCUMENTS 3,930,908 A    1/1976  Jolly
4,788,082 A *  11/1988 Schmitt .................... 427/248.1

(Continued)

FOREIGN PATENT DOCUMENTS

EP    173 715      4/1992
GB    2 336 553    10/1999

(Continued)

OTHER PUBLICATIONS

Kirk-Othmer. "Vacuum Technology". Encyclopedia of Chemical Technology. 4th Edition. vol. 24. 1997. pp. 750-753.*

(Continued)

*Primary Examiner* — David Turocy
(74) *Attorney, Agent, or Firm* — Morgan, Lewis & Bockius, LLP

(57) ABSTRACT

A method of depositing organic material is provided. A carrier gas carrying organic material is ejected from a nozzle at a flow velocity that is at least 10% of the thermal velocity of the carrier gas, such that the organic material is deposited onto a substrate. In some embodiments, the dynamic pressure in a region between the nozzle and the substrate surrounding the carrier gas is at least 1 Torr, and more preferably 10 Torr, during the ejection. In some embodiments, a guard flow is provided around the carrier gas.

14 Claims, 25 Drawing Sheets

(56) References Cited

U.S. PATENT DOCUMENTS

| | | | |
|---|---|---|---|
| 4,869,936 A * | 9/1989 | Moskowitz et al. | 427/455 |
| 5,256,205 A | 10/1993 | Schmitt, III et al. | |
| 5,356,673 A | 10/1994 | Schmitt et al. | |
| 5,421,888 A | 6/1995 | Hasegawa | |
| 5,554,220 A | 9/1996 | Forrest et al. | |
| 5,595,606 A | 1/1997 | Fujikawa et al. | |
| 5,650,197 A | 7/1997 | Halpern | |
| 5,707,745 A | 1/1998 | Forrest et al. | |
| 5,709,906 A * | 1/1998 | Bickford et al. | 427/306 |
| 5,720,821 A | 2/1998 | Halpern | |
| 5,759,634 A | 6/1998 | Zang | |
| 6,037,241 A | 3/2000 | Powell et al. | |
| 6,048,630 A | 4/2000 | Burrows et al. | |
| 6,056,823 A | 5/2000 | Sajoto et al. | |
| 6,065,492 A | 5/2000 | Bergamini | |
| 6,066,357 A | 5/2000 | Tang et al. | |
| 6,165,554 A * | 12/2000 | Halpern et al. | 427/248.1 |
| 6,337,102 B1 | 1/2002 | Forrest et al. | |
| 6,346,290 B1 | 2/2002 | Schultz et al. | |
| 6,468,605 B2 * | 10/2002 | Shah et al. | 427/600 |
| 6,482,266 B1 | 11/2002 | Matsumoto et al. | |
| 6,537,607 B1 | 3/2003 | Swanson | |
| 6,566,153 B1 | 5/2003 | Yang | |
| 6,572,706 B1 | 6/2003 | Nguyen et al. | |
| 6,716,656 B2 | 4/2004 | Shtein et al. | |
| 6,962,624 B2 | 11/2005 | Jurgensen et al. | |
| 2003/0054099 A1 | 3/2003 | Jurgensen et al. | |
| 2003/0054100 A1 | 3/2003 | Eser et al. | |
| 2003/0087471 A1 | 5/2003 | Shtein et al. | |

FOREIGN PATENT DOCUMENTS

| | | |
|---|---|---|
| JP | 6-027329 | 4/1994 |
| JP | 7-258828 | 10/1995 |
| WO | WO 85/03460 | 8/1985 |
| WO | WO 99/25894 | 5/1999 |
| WO | WO 01/61071 | 8/2001 |
| WO | WO 02/27064 | 4/2002 |

OTHER PUBLICATIONS

Zhang et al., Jet Vapor Deposition of Nanostructure Composite Materials, Materials Res. Soc. Symp. Proc., Mater. Res. Soc. Symposium Proc. 1193, 286, pp. 385-389, 1992.

Supplementary European Search Report from EP 0 277 0461 dated Jun. 12, 2007.

Forrest et al., "Intense Second Harmonic and Long-Range Structural Ordering in Thin Films of Organic Salt Grown by Organic Vapor Phase Deposition," Appl. Phys. Lett., vol. 68, pp. 1326-1328 (1996).

Shtein et al., "Effects of Film Morphology and Gate Dielectric Surface Preparation on the Electrical Characteristics of Organic Vapor Phase Deposited Pentacene Thin-Film Transistors," Appl. Phys. Lett., vol. 81, pp. 268-270 (2002).

Shtein, et al., "Micron scale patterning of organic thin films via organic vapor phase deposition", Presentation Outline from the Mat. Res. Soc. Ann. Meeting 2001, Boston.

Shtein et al., "Micropatterning of small molecular weight organic semiconductor thin films using organic vapor phase deposition", J. Appl. Phys., vol. 93, No. 7, pp. 4005-4016, Apr. 1, 2003.

S. Krumdieck, "Kinetic Model of Low Pressure Film Deposition from Single Precursor Vapor in a Well-Mixed, Cold-Wall Reactor", Acta mater 49, 583-588, 2001.

R.B. Bird, et al., Transport Phenomena, New York, John Wiley & Sons, Inc., pp. 508-513 (1960).

S.R. Forrest, "Ultrathin Organic films grown by organic molecular beam deposited and related techniques", Chem. Rev. vol. 97, No. 6, pp. 793-1896 (Sep./Oct. 1997).

S. Wolf and R. N. Tauber, Silicon Processing for the VLSI Era, Volume I: Process Technology, pp. 73-123 (Lattice, 1986).

M. A. Baldo, et al., Organic Vapor Phase Deposition, Adv. Mater. 10, No. 18, pp. 1505-1514 (1998).

G. B. Stringfellow, Organometallic Vapor-Phase Epitaxy: Theory and Practice, pp. 55-283 (Academic, London, 1989).

G. H. Olsen, "Vapour-phase Epitaxy of GaInAsP", GaInAsP Alloy Semiconductors, edited by T. P. Pearsall (Wiley, New York, 1982), pp. 11-41.

P. E. Burrows, et al., "Organic Vapor Phase Deposition: a new method for the growth of organic thin films with large optical non-linearities", J. Cryst. Growth 156, pp. 91-98 (1995).

K. M. Vaeth, et al., "Chemical vapor deposition of poly (p-phenylene vinylene) based light emitting diodes with low turn-on voltages", Appl. Phys. Lett. 71(15), pp. 2091-2093 (Oct. 13, 1997).

M. A. Baldo, et al., "Low pressure organic vapor phase deposition of small molecular weight organic light emitting device structures", Appl. Phys. Lett. 71(21), pp. 3033-3035 (Nov. 24, 1997).

M. Shtein, et al., Material transport regimes and mechanisms for growth of molecular organic thin films using low-pressure organic vapor phase deposition, J. Appl. Phys. 89:2, pp. 1470-1476 (Jan. 15, 2001).

Sybil P. Parker, ed., McGraw-Hill Dictionary of Scientific and Technical Terms, Fifth Edition, p. 1516 (1994).

ASTM, Compilation of ASTM Standard Definitions, Eighth Edition, p. 380 (1994).

CRC Handbook of Chemistry and Physics, 54th edition, CRC Press, 1973, p. E-225.

Shtein et al., "Process and apparatus for organic vapor jet deposition", U.S. Appl. No. 10/233,470, 2002.

The Notice of Preliminary Rejection (Office Action) was issued by the Korean Patent Office (KIPO) on Apr. 23, 2009 in the Korean Patent Application No. 2004-7003206.

Evaporation (deposition) http://en.wikipedia.org/wiki/Evaporation_(deposition). Accessed Jul. 28, 2009.

* cited by examiner

METHOD AND APPARATUS FOR DEPOSITING MATERIAL USING A DYNAMIC PRESSURE

CROSS-REFERENCES TO RELATED APPLICATIONS

This patent application is a continuation-in-part of U.S. application Ser. No. 12/786,982, filed May 25, 2010, which claims priority to U.S. patent application Ser. No. 12/175,641, filed Jul. 18, 2008 (now U.S. Pat. No. 7,722,927, issued May 25, 2010), which is a divisional of U.S. application Ser. No. 10/422,269, filed Apr. 23, 2003 (now U.S. Pat. No. 7,404,862, issued Jul. 29, 2008), which is a continuation-in-part of U.S. application Ser. No. 10/233,470, filed Sep. 4, 2002 (now U.S. Pat. No. 7,431,968, issued Oct. 7, 2008), which claims the benefit under 35 U.S.C. §119(e) of U.S. Provisional Applications Nos. 60/317,215, filed on Sep. 4, 2001, 60/316,264, filed on Sep. 4, 2001, 60/316,968, filed on Sep. 5, 2001, and 60/332,090, filed on Nov. 21, 2001, and which is related to U.S. application Ser. No. 10/233,482, filed on Sep. 4, 2002 (now U.S. Pat. No. 6,716,656, issued Apr. 6, 2004). All of these above-mentioned Applications are herein incorporated by reference in their entireties. This patent application is also a continuation-in-part of U.S. application Ser. No. 10/690,704, filed Oct. 23, 2003, which is incorporated by reference in its entirety.

STATEMENT AS TO RIGHTS TO INVENTIONS MADE UNDER FEDERALLY SPONSORED RESEARCH OR DEVELOPMENT

This invention was made with Government support under Contract No. F49620-92-J-0424 awarded by the U.S. Air Force OSR (Office of Scientific Research) and Contract No. DAAD19-02-2-00198 awarded by the Army Research Lab. The government has certain rights in this invention.

RESEARCH AGREEMENTS

The claimed invention was made by, on behalf of, and/or in connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

BACKGROUND OF THE INVENTION

Field of the Invention

The present invention relates to a method and apparatus for depositing material.

Molecular organic compounds are employed as active materials in a variety of applications, including organic light emitting diodes (OLEDs), organic phototransistors, organic photovoltaic cells, organic photodetectors, and thin films. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. For OLEDs, the organic materials may have performance advantages over conventional materials. For example, the wavelength at which an organic emissive layer emits light may generally be readily tuned with appropriate dopants.

Organic optoelectronic devices such as thin film transistors (TFTs), light emitting diodes (LEDs) and photovoltaic (PV) cells, have gained considerable attention of researchers during the past decade. Organic semiconductors can be deposited on a variety of substrates, which potentially simplifies and lowers fabrication costs when compared to inorganic semiconductors. However, the unique processing requirements of organic semiconductors can also limit their application. For example, light emitting devices and PV cells typically consist of thin (<100 nm) films of either conjugated polymers or monomers, sandwiched between conducting electrodes. For full-color displays and multi-transistor circuits, the active organic layers themselves must also be laterally patterned. However, the organic layers are typically too fragile to withstand conventional semiconductor processing methods such as photolithography, plasma processing, or reactive ion etching. Many fabrication and patterning techniques have therefore been developed to address these unique requirements, emphasizing primarily the ease and low cost of processing. Recent successes in fabricating OLEDs have driven the development of OLED displays (see S. R. Forrest, *Chem. Rev.* 97, 1793 (1997)). OLEDs make use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Several OLED materials and configurations are described in U.S. Pat. No. 5,707,745, which is incorporated herein by reference in its entirety.

Typically, these thin (~100 nm) film devices (including OLEDs and photovoltaic cells) are grown by thermal evaporation in high vacuum, permitting the high degree of purity and structural control needed for reliable and efficient operation (see S. R. Forrest, *Chem. Rev.* 97, 1793 (1997)). However, control of film thickness uniformity and dopant concentrations over large areas needed for manufactured products can be difficult when using vacuum evaporation (see S. Wolf and R. N. Tauber, *Silicon Processing for the VLSI Era* (Lattice, 1986)). In addition, a considerable fraction of the evaporant coats the cold walls of the deposition chamber. Over time, inefficient use of materials results in a thick coating which can flake off, leading to particulate contamination of the system and substrate. The potential throughput for vacuum evaporated organic thin film devices is low, resulting in high production costs. Low-pressure organic vapor phase deposition (LP-OVPD) has been demonstrated recently as a superior alternative technique to vacuum thermal evaporation (VTE), in that OVPD improves control over dopant concentration of the deposited film, and is adaptable to rapid, particle-free, uniform deposition of organics on large-area substrates (see M. A. Baldo, M. Deutsch, P. E. Burrows, H. Gossenberger, M. Gerstenberg, V. S. Ban, and S. R. Forrest, *Adv. Mater.* 10, 1505 (1998)).

Organic vapor phase deposition (OVPD) is inherently different from the widely used vacuum thermal evaporation (VTE), in that it uses a carrier gas to transport organic vapors into a deposition chamber, where the molecules diffuse across a boundary layer and physisorb on the substrate. This method of film deposition is most similar to hydride vapor phase epitaxy used in the growth of III-V semiconductors (see G. B. Stringfellow, *Organometallic Vapor-Phase Epitaxy* (Academic, London, 1989); G. H. Olsen, in *GaInAsP*, edited by T. P. Pearsall (Wiley, New York, 1982)). In LP-OVPD, the organic compound is thermally evaporated and then transported through a hot-walled gas carrier tube into a deposition chamber by an inert carrier gas toward a cooled substrate where condensation occurs. Flow patterns may be engineered to achieve a substrate-selective, uniform distribution of organic vapors, resulting in a very uniform coating thickness and minimized materials waste.

Using atmospheric pressure OVPD, Burrows et al. (see P. E. Burrows, S. R. Forrest, L. S. Sapochak, J. Schwartz, P. Fenter, T. Buma, V. S. Ban, and J. L. Forrest, *J. Cryst. Growth* 156, 91 (1995)) first synthesized a nonlinear optical organic salt 4'-dimethylamino-N¬methyl-4-stilbazolium tosylate. In a variation on this method, Vaeth and Jensen (see K. M. Vaeth and K. Jensen, *Appl. Phys. Lett.* 71, 2091 (1997)) used nitrogen to transport vapors of an aromatic precursor, which was polymerized on the substrate to yield films of poly (s-phenylene vinylene), a light-emitting polymer. Recently, Baldo and co-workers (see M. A. Baldo, V. G. Kozlov, P. E. Burrows, S. R. Forrest, V. S. Ban, B. Koene, and M. E. Thompson, *Appl. Phys. Lett.* 71, 3033 (1997)) have demonstrated what is believed to be the first LP-OVPD growth of a heterostructure OLED consisting of N,N-di-(3-methylphenyl)-N,N diphenyl-4,4-diaminobiphenyl and aluminum tris(8-hydroxyqumoline) ($Alq_3$), as well as an optically pumped organic laser consisting of rhodamine 6G doped into $Alq_3$. More recently, Shtein et al. have determined the physical mechanisms controlling the growth of amorphous organic thin films by the process of LP-OVPD (see M. Shtein, H. F. Gossenberger, J. B. Benziger, and S. R. Forrest, *J. Appl. Phys.* 89:2, 1470 (2001)).

Virtually all of the organic materials used in thin film devices have sufficiently high vapor pressures to be evaporated at temperatures below 400° C. and then to be transported in the vapor phase by a carrier gas such as argon or nitrogen. This allows for positioning of evaporation sources outside of the reactor tube (as in the case of metalorganic chemical vapor deposition (see S. Wolf and R. N. Tauber, *Silicon Processing for the VLSI Era* (Lattice, 1986); G. B. Stringfellow, *Organometallic Vapor-Phase Epitaxy* (Academic, London, 1989))), spatially separating the functions of evaporation and transport, thus leading to precise control over the deposition process.

Though these examples demonstrate that OVPD has certain advantages over VTE in the deposition of organic films, especially over large substrate areas, the prior art has not addressed the special problems that arise when depositing an array of organic material.

As is the case for fabrication of arrays using VTE, to adapt OVPD to OLED technology, a shadow mask delineating the shape of the desired pixel grid is placed close to the substrate to define the pattern of deposition on the substrate. Control of the shadow mask patterning is a critical step, for example, in the fabrication of full-color OLED-based displays (see U.S. Pat. No. 6,048,630, Burrows, et al.). Ideally, the resultant pattern on a substrate is identical to that cut into the shadow mask, with minimal lateral dispersion and optimal thickness uniformity of the deposited material. However, despite the overall advantages of OVPD in depositing organic layers, the use of the shadow mask in OVPD has certain disadvantages including: significant lateral dispersion compared to VTE; material waste; potential for dust contamination on the film from the mask; and difficulty in controlling the mask-substrate separation for large area applications.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

Early methods of patterning organic materials involved the deposition of organic materials through a mask. The organic materials may be deposited through an "integrated" mask which is attached to the substrate on which the device is being fabricated, as disclosed in U.S. Pat. No. 6,596,443, issued on Jul. 22, 2003, which is incorporated by reference in its entirety. Or, the organic materials may be deposited through a shadow mask that is not integrally connected to the substrate, as disclosed in U.S. Pat. No. 6,214,631, issued on Apr. 10, 2001, which is incorporated by reference in its entirety. However, the resolution that may be achieved with such masks is limited due to a number of factors, including the resolution to which a mask may be reliably fabricated, the buildup of organic material on the mask, and the diffusion of organic material in between the mask and the substrate over which it is being deposited.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

"Ambient" as used herein refers to the default state of a parameter, when no effort is made to control that parameter beyond the normal efforts associated with a home or office building. For example, ambient atmosphere is 1 atm (or thereabout depending on elevation) having the general chemical composition of air, and ambient temperature is room temperature, or approximately 25 degrees C. (or thereabout). "Background" pressure is the pressure in a chamber (vacuum or otherwise), measured far from any effects caused, for example, by an OVJP jet.

BRIEF SUMMARY OF THE INVENTION

The present invention may provide methods for the patterned deposition of organic materials onto substrates without the need for a shadow mask.

A method of depositing organic material is provided. A carrier gas carrying an organic material is ejected from a nozzle at a flow velocity that is at least 10% of the thermal velocity of the carrier gas, such that the organic material is deposited onto a substrate.

In some embodiments, the dynamic pressure in a region between the nozzle and the substrate surrounding the carrier gas is at least 1 Torr, and more preferably 10 Torr, during the ejection. In some embodiments, a guard flow is provided around the carrier gas. In some embodiments, the background pressure is at least about 10 e-3 Torr, more preferably about 0.1 Torr, more preferably about 1 Torr, more preferably about 10 Torr, more preferably about 100 Torr, and most preferably about 760 Torr.

A device is also provided. The device includes a nozzle, which further includes a nozzle tube having a first exhaust aperture and a first gas inlet; and a jacket surrounding the nozzle tube, the jacket having a second exhaust aperture and a second gas inlet. The second exhaust aperture completely surrounds the first tube aperture. A carrier gas source and an organic source vessel may be connected to the first gas inlet. A guard flow gas source may be connected to the second gas inlet. The device may include an array of such nozzles.

DETAILED DESCRIPTION OF THE INVENTION

Figure 1:
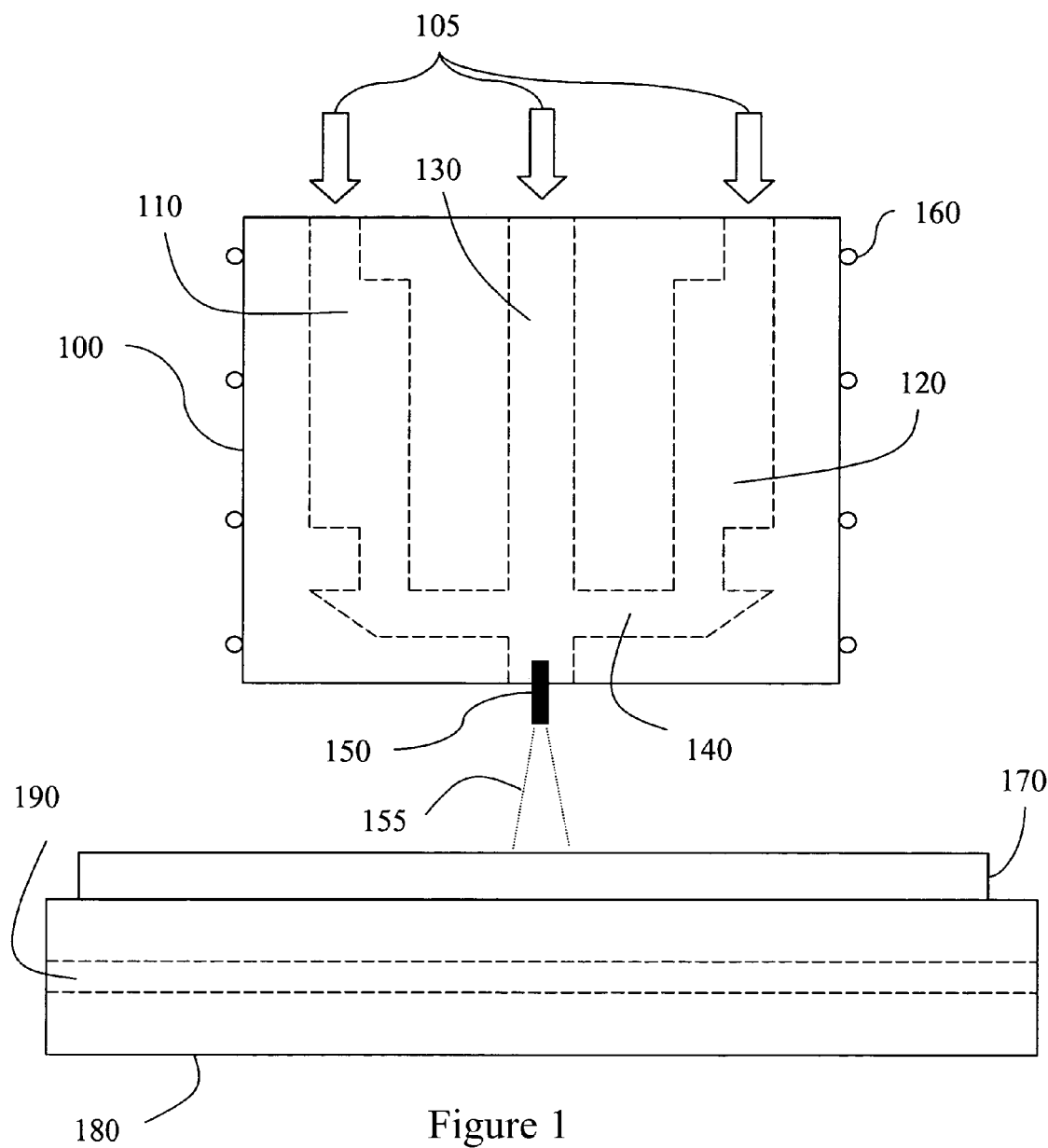
FIG. 1 shows an embodiment of an OVJP apparatus having multiple source cells.

The present invention will be described with reference to the following illustrative embodiments.

As described in U.S. application Ser. No. 10/233,470, filed Sep. 4, 2002 (now U.S. Pat. No. 7,431,968), which is incorporated herein by reference in its entirety, organic vapor jet deposition (OVJD) is a technique that allows for direct patterning of organic films on substrates. In general, OVJD also may be referred to herein as organic vapor jet printing (OVJP). OVJD, or OVJP, uses an inert carrier gas, such as nitrogen or argon, to transport the organic vapors from their source(s) and eject them from one or more nozzles, producing collimated jets of organic vapor and carrier gas. Upon striking the substrate, the organic vapors are condensed out of the jet, forming a patterned deposit, whose shape can be controlled by engineering the nozzle shape and flow dynamics of the organic vapor and carrier gas.

Organic vapor jet printing (OVJP) allows for the direct patterning during growth of molecular organic semiconductor thin films. A hot inert carrier gas picks up organic vapor and expands through a microscopic nozzle, resulting in a highly collimated jet. The jet impinges on a cold substrate, leading to the selective physisorption of the organic molecules but not the carrier gas. The non-equilibrium nature of OVJP allows for high resolution, nearly 100% efficient, direct printing of organic semiconductor patterns and devices. The deposition rates may be very high, for example up to and exceeding 1000 Å/s. We demonstrate pattern resolution determined in part by the nozzle diameter and separation from the substrate. For example, employing a 20 μm diameter orifice, we obtained patterns of ~25 μm in diameter (1000 dots per inch). Further, we print an archetypal pentacene channel thin film transistor at a film deposition rate of 700 Å/s, resulting in hole mobility of 0.25 $cm^2/V \cdot s$ and current on/off ratio of $7 \cdot 10^5$, (comparable to performance achieved with vacuum deposited devices). Using a scaling analysis the influence of process conditions on the printing resolution and speed are determined. Combinatorial printing experiments and direct simulation Monte-Carlo models support the analysis. The printing of molecular organic semiconductors by OVJP allows for the rapid fabrication of both small- and large-scale electronic circuits. The process can be carried out in a range of upstream-to-downstream pressure gradients, depending on the nozzle size and number, while the downstream pressure preferably ranges from 0.1 to 1000 Torr. Due to the highly localized and directional characteristic of OVJP, embodiments of the invention allow for the direct organic film patterning is possible for substrates of virtually arbitrary size and shape. In addition to organic electronic device application, the method of OVJP provides access to new film growth regimes using highly localized hyperthermal organic beams, with additional, new degrees of control of film and crystal morphology.

In embodiments of organic vapor jet printing (OVJP), a hot inert carrier gas picks up molecular organic vapor and expands through a microscopic nozzle. The resulting collimated gas jet impinges onto a cold substrate, leading to the selective, localized deposition of the organic molecules, but not the carrier gas. Because OVJP does not use liquid solvents, it allows for greater latitude in the choice of substrate material and shape than other processes such as ink-jet printing, thereby permitting a wider variety of organic semiconductors and structures to be deposited. The molecules used for organic devices are typically stable against decomposition and pyrolysis up to 350-450° C., while having vapor pressures of up to several millibar, allowing high practical deposition rates.

One unique aspect of OVJP is that the organic species can be accelerated by the flow of a much lighter carrier gas to hyperthermal velocities. This can lead to denser and more ordered thin films, which potentially broadens the processing window for ultra-rapid growth of high quality thin films for device applications. This acceleration may also the instantaneous local deposition rate of OVJP to exceed that of the alternative broad-area deposition methods, resulting in a competitive advantage in the rapid printing of large-scale electronics. A typical OLED heterostructure is ~2000 Å thick. At 1000 Å/s and using a linear array of nozzles, each having a diameter to match the pixel width, a 1000 pixel wide display can be printed in ~30 minutes. The growth rates in the experiments discussed herein are already several orders of magnitude higher than the typical rates reported for fabrication of molecular organic electronic devices, but they can be increased further—for each 10° C. increase in the source temperature, the evaporation rate approximately doubles. OVJP is preferably used to deposit small molecule organic materials because they generally have sufficient vapor pressure at reasonable temperatures to allow for a high deposition rate. However, OVJP may have applications to other materials, such as polymers.

Embodiments of OVJP generally involve a "jet" of gas ejected from a nozzle, as distinct from other techniques, such as OVPD (organic vapor phase deposition), where a carrier gas may be used, but there is no "jet." A "jet" occurs when the flow velocity through the nozzle is sufficiently large to result in a significantly anisotropic velocity distribution relative to the isotropic velocities of a stagnant gas with molecules bouncing around. One way of defining when a jet occurs is when the flow velocity of the carrier gas is at least 10% of the thermal velocity of the carrier gas molecules.

Figure 2:
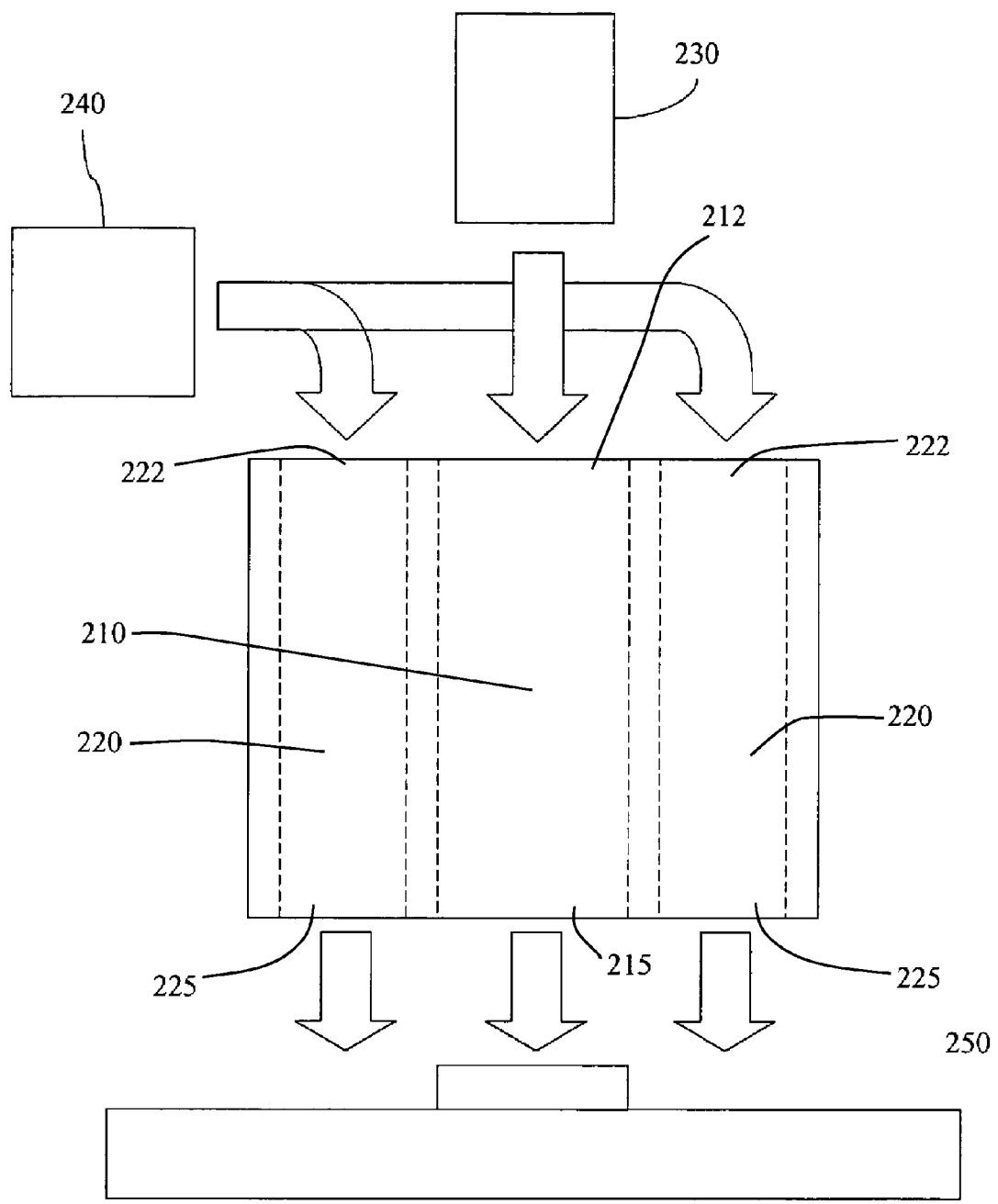
FIG. 2 shows an embodiment of an OVJP nozzle that can produce a guard flow.

More generally, embodiments of the invention allow for patterned vapor phase deposition at pressures higher than previously thought possible in a region between a nozzle and a substrate. Specifically, this "region between a nozzle and a substrate" is the region surrounding the jet of carrier gas as it travels from the nozzle to the substrate, which may interact with the jet. One way of controlling the pressure in this region is through the background pressure, which is the pressure in the room, vacuum chamber, or other area in which the deposition is occurring—for example, by depositing in a vacuum chamber. Another way of controlling this pressure is though the use of a guard flow, as described herein and as illustrated in FIG. 2, for example. A guard flow may be desirable even in a pressure controlled environment such as a vacuum chamber, to mitigate the effect of any impurities that may be present.

An embodiment of an OVJP apparatus is schematically illustrated in FIG. 1. Device 100 includes a first organic source cell 110, a second organic source cell 120, a dilution channel 130, a mixing chamber 140, a nozzle 150, and heating elements 160. Organic source cells 110 and 120 may contain organic materials for deposition on a substrate 170. Each organic source cell may contain a different organic material or combination of organic materials. Carrier gas source(s) 105, schematically represented as arrows, may provide a flow of carrier gas to organic source cells 110 and 120, and dilution channel 130. Valves or other mechanisms may be used to determine whether, and how much, carrier gas flows through each of the organic source cells 110 and 120, and dilution channel 130. When a carrier gas flows through an organic source cell, the organic material contained therein may sublimate, and is subsequently carried by the carrier gas. The organic material and carrier gas then mixes in the mixing chamber with any other carrier gas and/or organic materials that enters from either the dilution channel or another organic source cell. Dilution channel 130 may be used to achieve more precise control at lower organic material concentrations than might be possible without a dilution channel. The mixture of one or more organic materials and carrier gas is then expelled through nozzle 150 towards substrate 170. Heating elements 160 may be used to control the temperature of the carrier gas and organic materials in device 100. By controlling the flow velocity and other parameters as explained herein, the flow mechanics of the expelled material may be controlled to form a collimated jet 155. Substrate 170 is disposed over a substrate holder 180, which may include a cooling channel 190. Any suitable positioning mechanism may be used to control the relative positions of substrate 170 and device 100. Cooling channel 190 may be connected to a coolant source, and may be used to control the temperature of substrate holder 180 and substrate 170. The organic material is then deposited on substrate 170, and the carrier gas flows away to the sides.

Device 100 may be made of any suitable material. Stainless steel is preferred for its durability and heat conductivity. Although only two organic source cells 110 and 120 are shown for clarity, more or less organic source cells may be used. Preferably, heating elements 160 may achieve a uniform heating of device 100. Preferably, individually metered carrier gas streams flow through each source cell to regulate the rate of delivery of the organic vapor. Device 100 also allows for "make-up" and "pusher" gas flow through dilution channel 130. A make-up gas flow may be used to regulate the concentration of organic vapor in addition to the source temperature. Pusher gas flow helps to avoid back-diffusion of vapor. In the embodiment of FIG. 1, both make-up and pusher functions may be achieved through dilution channel 130. The motion of substrate 170 is preferably along all 3 axes and computer-controlled.

Another embodiment of an OVJP apparatus is schematically illustrated in FIG. 2. Nozzle 200 comprises a nozzle tube 210 and a jacket 220. Nozzle tube 210 is defined by nozzle tube wall 217. Jacket 220, which is disposed adjacent to nozzle 210, is defined by nozzle tube wall 217 and jacket wall 227. Nozzle tube 210 has a first gas inlet 212 and a first exhaust aperture 215. Jacket 220 has a second gas inlet 222 and a second exhaust aperture 225. A carrier gas source 230 provides a flow of carrier gas carrying organic material to first gas inlet 212. A guard flow source 240 provides a flow of guard flow gas to second gas inlet 222. The carrier gas, carrying material to be deposited, flows out of first exhaust aperture 215. The guard flow gas flows out of second exhaust aperture 225. The gas sources of FIG. 2 are illustrated generally, and may include any components associated with providing a controlled gas flow to the nozzle, such as tubes, valves, gas cylinders, temperature control apparati, and other components.

Figure 3:
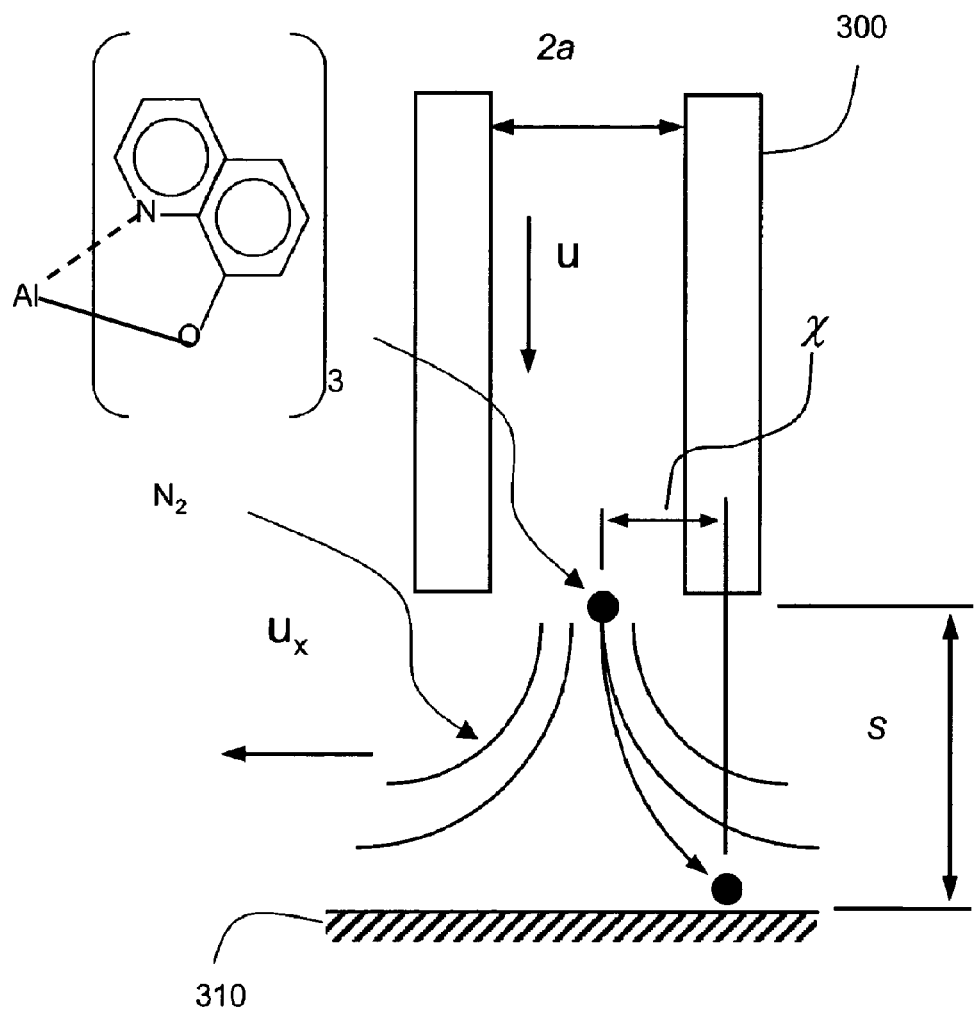
FIG. 3 shows a schematic of an OVJP nozzle illustrating carrier gas and organic molecule trajectories.

In heated embodiments, heat may be provided in a variety of ways. The carrier gas source is preferably heated to a temperature suitable to sublimate, in a source cell, the appropriate concentration of molecule to be deposited. Other heat sources may be desirable to prevent the molecule from depositing onto the nozzle and elsewhere (other than the substrate, where deposition is desired) as it progresses out of the source cell and beyond. Preferably, the guard flow source provides heated guard flow gas, which then heats nozzle tube wall 217. Other heated embodiments may be achieved by using RF or other heating mechanisms to directly heat parts of nozzle 200, such as nozzle tube wall 217 and/or jacket wall 227.

An appropriate guard flow may confine the carrier gas and the molecules being deposited, and prevent them from spreading. Thus, a desirable sharper and higher resolution may be achieved. Preferably, the guard flow comprises a relatively heavy gas as compared to the carrier gas. Preferably, the guard flow gas is heavier than the molecular weight of the carrier gas, which enables the guard flow to more effectively contain the carrier gas.

Although the deposition can be carried out at atmospheric conditions, the downstream pressure, $P_L$, is reduced to 0.1-10 Torr in some embodiments to promote mass transport. To maintain the edge sharpness for deposited patterns as small as 25 μm the nozzle-to-substrate separation, s, is kept on the order of the molecular mean free path, λ, at the deposition pressure, (e.g. 100 um>λ>1 μm for 0.1 Torr<$P_L$, <10 Torr). Edge sharpness is preferred for some embodiments but not necessary. When λ is on the order of the apparatus dimension (which can be taken as either s, the nozzle diameter, a, or nozzle length, L), the flow is said to undergo a transition from the continuum to the free molecular flow regimes. Typical OVJP conditions result in such transition regime flow.

A description of the physical picture of transitional flow may be derived from experiment and direct simulation Monte-Carlo (DSMC) techniques. The present specification, in addition to demonstrating OVJP of high-resolution organic thin film patterns and devices, examines how process conditions affect the growth rate and pattern resolution. A scaling model is developed and compared to DSMC simulations and OVJP experiment.

A mass balance on the organic species in the source cell (7) gives the expression for the vapor pressure of the organic species exiting the source cell:

$$P_{org} = \frac{P_{org}^{sat} \cdot k}{k + \dot{V} / RT_{cell}} \tag{1}$$

where $P_{org}$ is the vapor pressure, $P_{org}{}^{sat}$ is the saturation (equilibrium) vapor pressure of the organic material, $\dot{V}$ is the carrier gas volumetric flow velocity, and k is a constant describing the kinetics of the evaporation from the organic surface inside the source cell. Equation (1) shows that the carrier gas flow rate, as well as the source temperature, may regulate the flux of organic vapor, which is a consideration for regulating the concentration of dopants in the deposited films.

Downstream from the source cell, OVJP differs significantly from vapor-phase deposition and ink jet printing. Unlike vapor-phase deposition, OVJP is not diffusion limited near the substrate, and, unlike ink jet printing, OVJP does not take place in the liquid phase. The flow rate of gas through the nozzle, Q, is the product of the pressure driving force and the nozzle conductance:

$$Q = C \cdot (P_H - P_L) \tag{2}$$

where the driving force is the difference in the upstream and downstream pressures ($P_H$ and $P_L$), and the conductance, C, is expressed as:

$$C = \left[\frac{4}{3L}\sqrt{\frac{2\pi kT}{M}a^3}\right] \cdot \left(0.1472\frac{a}{\lambda} + \frac{1 + 3.50a/\lambda}{1 + 5.17a/\lambda}\right) \tag{3}$$

where the quantity in the first brackets is calculated from the kinetic theory, and then modified by an empirical factor for different gas mixtures and conditions. Due to the large difference in the molecular weights of the organic and carrier gas species used in OVJP, Eq. (3) may be further corrected to reflect thermal slip near the inner wall of the nozzle.

While the light carrier gas species are strongly scattered radially by the substrate, the heavier organic species retain more of their axial momentum (in proportion to the ratio of the organic molecular masse to that of the carrier gas, $m_o m_c$). This mechanism is confirmed by DSMC results, as shown in FIGS. 4 and 5. If the separation s is on the order of the λ near the substrate, the organic molecules suffer few collisions within the nozzle-substrate gap. Assuming that the organic moieties attain the bulk flow velocity $\bar{u}$ inside the nozzle, their transport rate $u_z$ in the z-direction is:

$$u_z \approx \bar{u} = Q/\pi a^2 \tag{5}$$

The average velocity with which the organic molecules are dispersed radially outward from the nozzle may be expressed as:

$$u_r \approx \bar{u} \cdot \frac{a}{2s} \cdot \frac{m_c}{m_o} \cdot \frac{s}{\lambda} + v_D \tag{6}$$

where χ is the radial distance traveled after emerging from the nozzle, $m_c$ and $m_o$ are the carrier gas and organic molecular weights, respectively, while $v_D$, is the contribution from pure diffusivity of the organic particle. This (isotropic) diffusion contribution can be approximated by:

$$v_D = \frac{\sqrt{6Dt}}{t} \tag{7}$$

where D and t are the gas diffusivity of the organic species and the time spent en route to the substrate, respectively.

Assuming fully developed flow inside the nozzle, a low (<1% molar) concentration of the organic species, incompressible flow and mass conservation of the carrier gas phase, it can be shown that the organic molecules travel radially outward from their original position in the nozzle by a distance χ:

$$\frac{\chi}{a} = \frac{m_c}{m_o} \cdot \frac{s}{\lambda} + \sqrt{\frac{1}{3} \cdot \frac{\bar{c} \cdot s \cdot \lambda}{\bar{u} \cdot a^2}} \tag{8}$$

where, $m_c/m_o$ is the organic-to-carrier gas molecular mass ratio, $\bar{c}$ is the molecular mean thermal velocity, and $\bar{u}$ is the mean flow velocity inside the nozzle. The first term in Eq. (8) quantifies the horizontal momentum transfer to the organic molecules from collisions with the diverging carrier gas, while the second term represents the scaling of the radial diffusion rate to the ballistic transport rate normal to the substrate.

Although Eq. (8) does not predict the exact deposit shape, it shows the relative influence of process conditions on the deposited pattern resolution. In particular, given that λ=kT/

$\sqrt{2\sigma P_L}$, where σ is the cross-section of the molecule, the dispersion has a minimum for some value of $P_L$, as shown in FIG. 3. The value of $P_L$ corresponding to maximum resolution is in the range of 1-50 Torr for typical OVJP conditions. Equation (8) also suggests that pattern definition is enhanced through use of a lighter carrier gas (e.g. He instead of $N_2$). Practically, $\bar{u}$ is fixed by the desired deposition rate via the total flux of the organic molecules in the nozzle. Thus, for a given nozzle radius a, the remaining adjustable parameters are s and $P_L$. The operating conditions for maximum pattern resolution can thus be plotted on a process diagram (FIG. 4), where the operating line dictates values of s for any given $P_L$. For example, to maintain high pattern resolution even at large separation, s, the downstream pressure, $P_L$, may be decreased. The region above the operating line represents diffusion-limited printing, while the region below corresponds to convection-limited operation. Finally, the local dynamic pressure in the region between the nozzle and the substrate generally exceeds $P_L$ and scales inversely with s. This places a lower limit on the effective $P_L$, as indicated by the "Dynamic Pressure Line", such that the minimum in the pattern dispersion curve with $P_L$ may not be observable under practical OVJP conditions.

A common feature of a single nozzle expansion is that it produces a flux profile domed in the center for virtually all upstream and downstream conditions. Thus, to achieve a flattened-top deposit, the nozzle can be rastered over an area. Alternatively, a bundle of nozzles or a miniaturized "showerhead" can be used to produce the same effect. Since the conductance of a nozzle scales with $\alpha^3$ (see Eq. 4), the printing speed can be maximized in the latter approach. Furthermore, in view of Eq. (8), an annular guard flow of a relatively heavy gas (e.g. Ar or $SF_6$) may be used in conjunction with a main flow of a lighter gas (e.g. $H_2$ or He) to increase deposit sharpness. The annular guard flow may be used in connection with other methods of increasing sharpness, such as rastering and the showerhead approach. With a guard flow, the organic species are maximally accelerated and collimated by the main carrier gas flow, while the radial diffusion of species is hindered by the guard flow made up of a heavier inert gas.

FIG. 3 shows a schematic illustrated of a nozzle 300 having a hollow cylindrical configuration, in the vicinity of a substrate 310. Carrier gas stream lines (solid black lines) and an expected trajectory of an organic molecule (curved arrow) are qualitatively illustrated. Several variables from Equations 1-8 are illustrated as well. Although the carrier gas flow field rapidly diverges due to the proximity of the substrate to the nozzle outlet, the relatively heavy organic molecules acquire trajectories substantially more collimated than the carrier gas. As discussed herein, the interplay between diffusive and convective processes at the nozzle orifice dictates the relationship between the pattern shape, nozzle radius (a), nozzle-to-substrate separation (s), and the pressure in the region downstream from the nozzle ($P_L$). The scaling is usually such that s, the pattern resolution, and the molecular mean free path (λ) at $P_L$ are of the same magnitude, as indicated in FIG. 3. This implies that downstream from the nozzle, transport is intermediate between continuum and molecular flow. Experiment and direct simulation Monte-Carlo (DSMC) techniques are the best ways to obtain an understanding of this type of transport.

Figure 4:
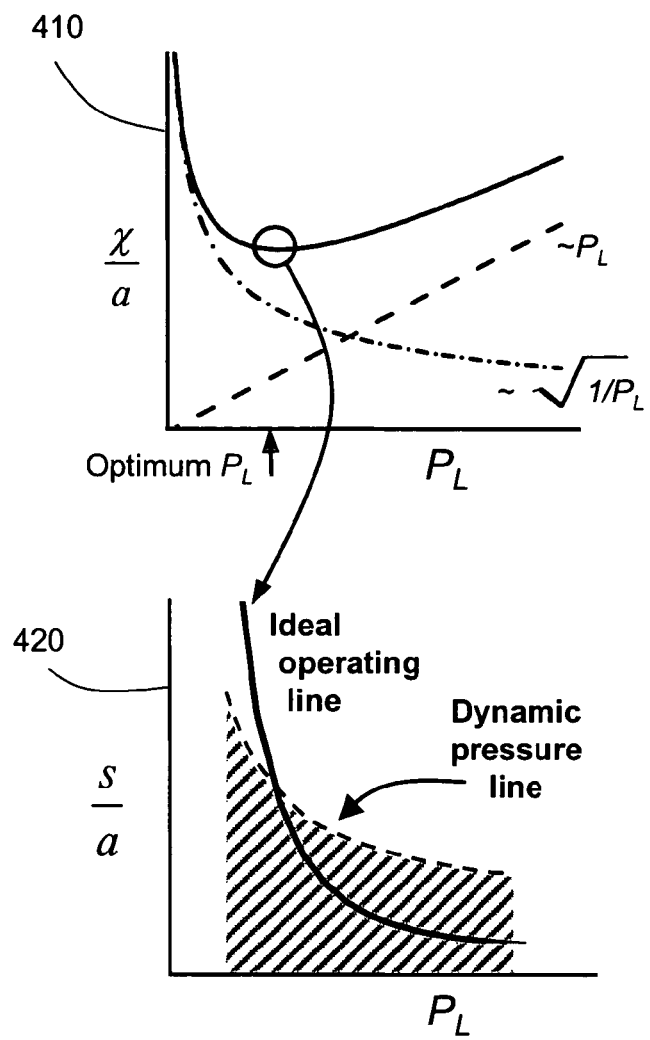
FIG. 4 shows a plot of the qualitative dependence of the normalized deposit width vs. downstream pressure, and a related plot of the qualitative relationship between nozzle radius, nozzle/substrate separation, and downstream pressure.

FIG. 4 shows a plot of the qualitative dependence of the pattern dispersion, χ/α, on the downstream pressure, $P_L$, and a related plot of the relationship between nozzle radius, nozzle/substrate separation, and downstream pressure. Plot 410 shows a plot of the qualitative dependence of the pattern dispersion, χ/α, on the downstream pressure, $P_L$. The dispersion is minimized at a given value of $P_L$, due to the opposing balance of convective and diffusive transport rates. Plot 420 shows a plot of the relationship between nozzle radius, nozzle/substrate separation, and downstream pressure, for the region identified by a circle in plot 410. The conditions for the highest pattern resolution (minimum dispersion) are plotted to give the optimum operating line. Working above or below this line may decrease pattern resolution. Increasing s and $P_L$, results in diffusion controlled transport, while decreasing s and $P_L$ results in convection controlled transport. The actual "dynamic pressure," i.e. the pressure between the nozzle and the substrate surrounding the jet, may be higher than the ambient (or background) pressure $P_L$, due to the interaction between the jet and the ambient pressure. Hence, the "dynamic pressure" line is lower and sets the practical operating regime. The operating regime signified by the shaded region under the dynamic pressure line is inaccessible by some embodiments. Without being limited to any theory as to how the invention works, it is believed that the jet flow decelerates near the substrate, and a part of the kinetic energy of the jet stream is converted into potential energy in the form of a higher pressure in the region immediately surrounding the jet stream.

While there is no simple qualitative relationship that exactly determines the dynamic pressure as a function of various relevant parameters such as the background pressure, the stream velocity, etc., it is believed that the dynamic pressure will generally not exceed 10 times the background pressure for the case of a jet ejected from a nozzle without a guard flow, at velocities reasonably contemplated for OVJP, and where the nozzle-substrate separation is on the same order of magnitude as the nozzle radius. In most cases, the dynamic pressure will not exceed twice the ambient pressure. The simulation needed to determine the dynamic pressure is well within the skill of one in the art based on the disclosure herein.

Figure 5:
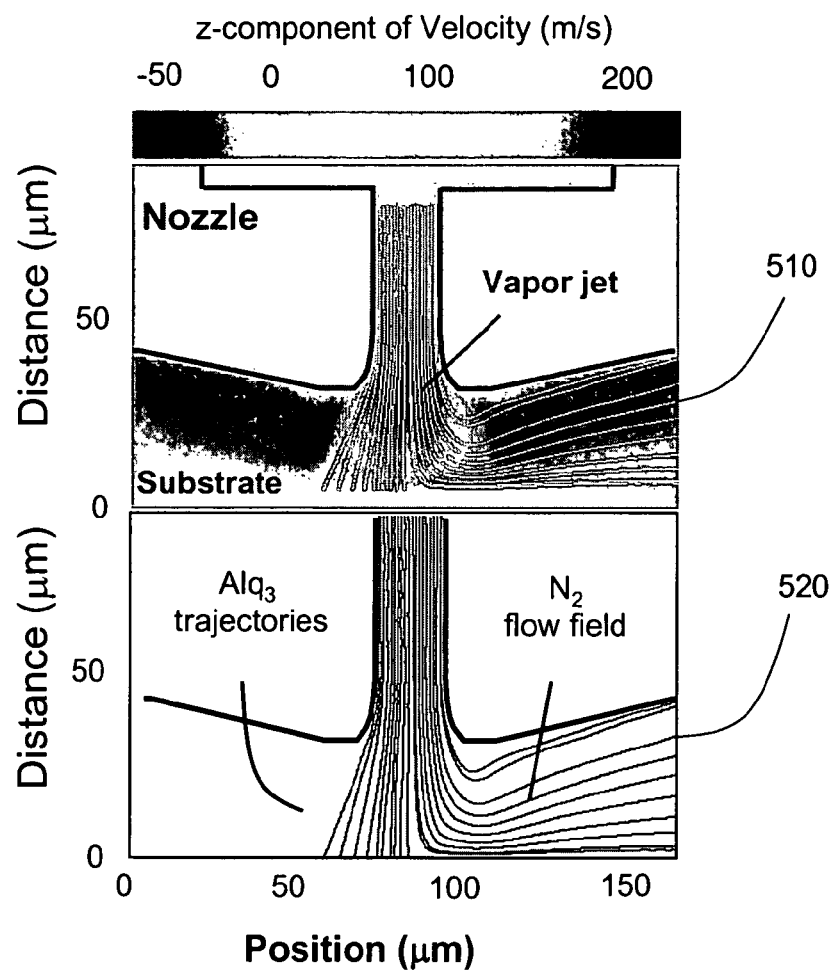
FIG. 5 shows calculated velocity and flow lines for particles ejected from a nozzle.

Details of the flow calculated by DSMC are shown in FIG. 5. Plot 510 shows a vertical velocity component of the flow field. The corresponding trajectories of the carrier gas and the organic molecules (in this case, tris-(8-hydroxyquinoline)-aluminum, or $Alq_3$) plotted in plot 520. The velocity map shows the acceleration of the flow through the nozzle, reaching a velocity ~200 m/s at the nozzle exit, and the stagnation front immediately above the substrate surface, where the dynamic pressure generally exceeds the ambient pressure, $P_L$, far away from the nozzle region. Velocity is represented as shading on plot 510, with the highest velocity in the nozzle, and the lowest furthest away from the nozzle. The heavy organic molecular trajectories, however, cross the carrier gas flow lines, resulting in a well-defined deposit. Preferably, the molecular weight if the organic material is greater than the molecular weight of the carrier gas to achieve this divergence between the organic trajectories and the carrier gas trajectories.

Figure 6:
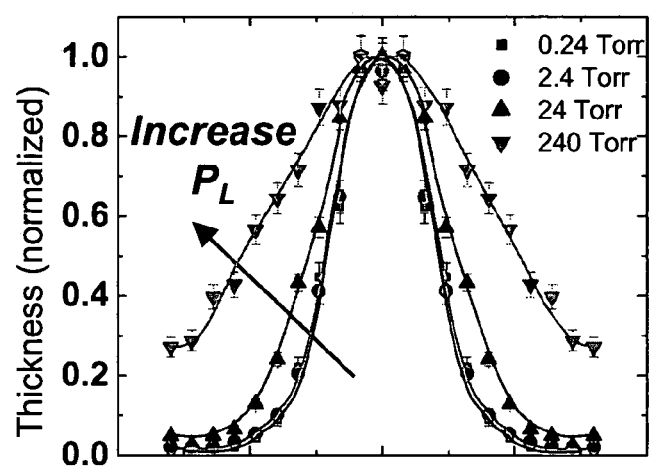
FIG. 6 shows calculated thickness profiles for various downstream pressures.
Figure 7:
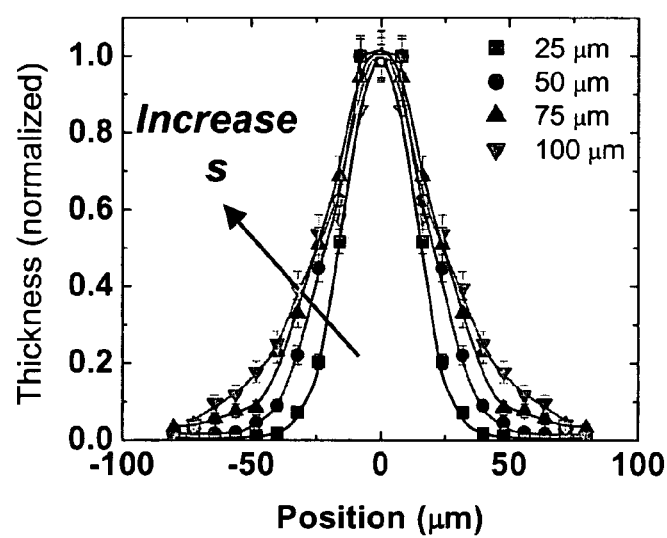
FIG. 7 shows calculated thickness profiles for various nozzle-substrate separation distances.

The deposit profiles obtained from DSMC for different printing conditions are plotted in FIGS. 6 and 7, where the broadening of the deposit due to increasing s and $P_L$ is evident. The pattern width first varies slowly with $P_L$, but then increases rapidly, indicating that the conditions are near the dispersion minimum, but that the dynamic pressure exceeds $P_L$.

It is believed that the profile of the deposited material is favorably affected by a dynamic pressure of at least 1 Torr, and more preferably be a dynamic pressure of at least 10 Torr.

In some embodiments, specific apparatus configurations may be used to achieve specific deposition advantages or arrangements. For example, an embodiment of the device can be used to pattern both single-component and doped organic thin films on a substrate. Furthermore, embodiments of the device of the invention can be used for the rapid deposition of laterally patterned, doped films and multi-layer structures.

Figure 16:
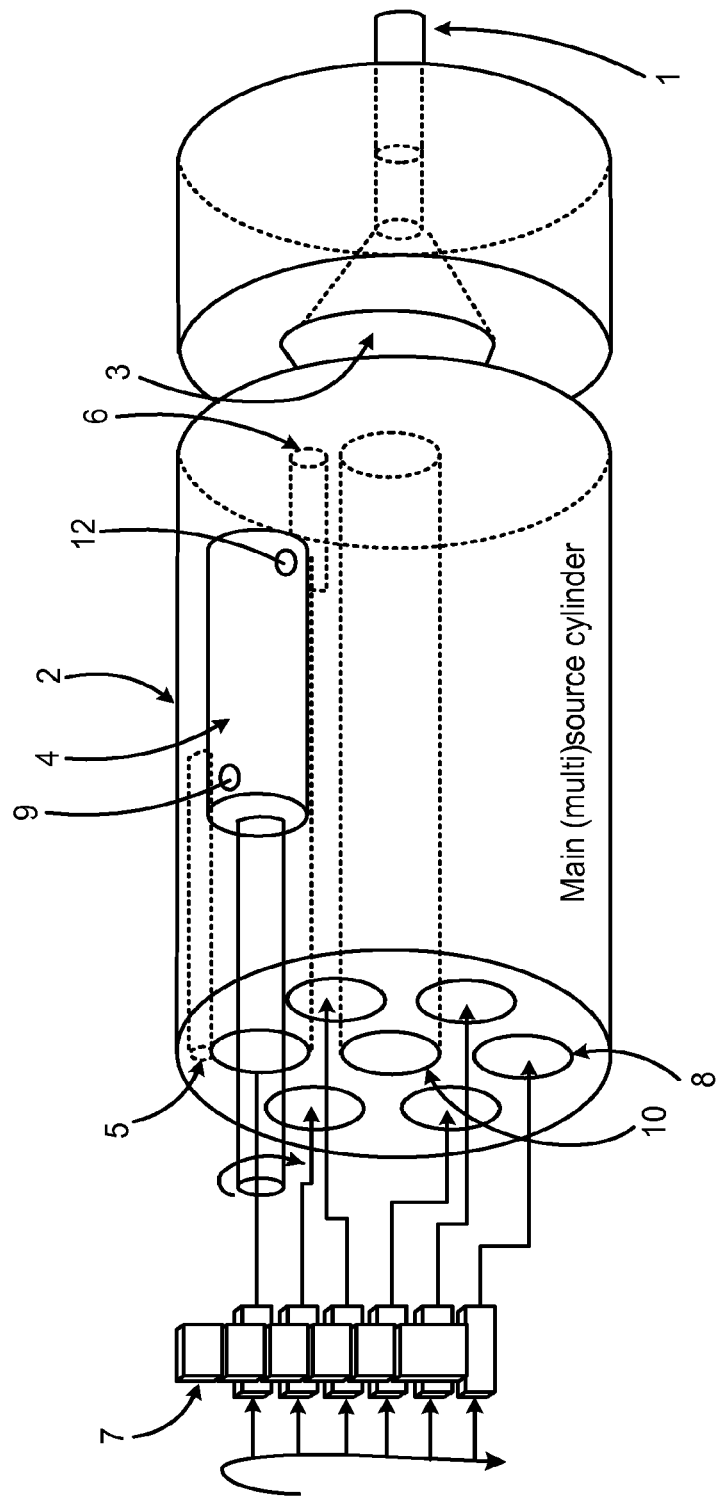
FIG. 16 shows an embodiment of an OVJP apparatus.

In an embodiment of the device as depicted in FIG. 16, the device includes a nozzle 1, and an apparatus 2, with one or more source cells 4, integrally connected to the nozzle 11 via a mixing chamber 3. In this embodiment, the integral connection between the apparatus 2 and the one or more nozzles 1 refers to their close, proximal relationship. Although the apparatus 2 and the one or more nozzles 1 are not necessarily rigidly connected to each other nor made from a single piece of material, they are situated close enough together such that they can be moved together as a single unit. The apparatus 2 also includes a carrier gas inlet channel 5 leading to each source cell 4, a carrier gas outlet channel 6 leading from each source cell 4 to the mixing chamber 3, and a first valve 7 capable of controlling the flow of a carrier gas through the one or more source cells 4. In addition, the apparatus 2 includes a dilution channel 10 located in the middle of the apparatus 2 which can be used to allow carrier gas to pass through to the mixing chamber 3 without passing through a source cell 4, thereby diluting the concentrations of the organic vapors in the mixing chamber 3. The dilution channel 1610 can also serve as a pressure relief channel for the device. In addition, although the dilution channel 1610 is located in the middle of the apparatus 2 in the embodiment of the device as depicted in FIG. 16, other embodiments of the device can include the dilution channel 1610 located at other positions within the apparatus 2.

In a preferred embodiment of the invention, there are a plurality of source cells 4 to enable the deposition of multiple organic materials through a single mixing chamber 3 and nozzle 1. The flow of carrier gas through the source cells 4 may be separately controlled for each source cell 4, such that different organic materials or different mixtures of organic materials may be deposited at any given time. For example, as is known in the art of manufacturing OLEDs, the emissive layer of an OLED may contain an emissive organic molecule (a dopant) doped into a different organic host material. Thus, this preferred embodiment of the invention could include a source cell 4 containing an organic dopant material, such as fac tris(2-phenylpyridine) iridium $(Ir(ppy)_3)$, and another source cell 4 containing an organic host material, such as 4,4'-N,N'-dicarbazole-biphenyl (CBP), wherein the flow of carrier gas through these source cells 4 is controlled such that the desired amounts of CBP and $Ir(ppy)_3$ are transported into the mixing chamber 3. Thereafter, the resulting organic layer deposited by such an embodiment of the device comprises a CBP layer doped with Ir(ppy)3.

In the embodiment shown in FIG. 16, the apparatus 2 comprises a single-piece structure in the form of a cylinder containing one or more source cells 4 (only one of which is shown in FIG. 16), with each source cell containing an organic material. Each of the source cells 4, which are also in the form of cylinders, are contained in a cylindrical source bore 8 in the apparatus. Although both the apparatus 2 and the source cells 4 (along with the accompanying cylindrical source bores 8) are in the form of a cylinder in FIG. 16, the apparatus and the source cells may be in various other geometrical forms, including but not limited to, a square block, a rectangular block, a hexagonal block, and an octagonal block. Furthermore, both the apparatus and the source cells may have tapered geometries, such that the inlet and outlet ends of the apparatus and/or source cell would have different radii or dimensions. In addition, although the embodiment of the device shown in FIG. 16 includes a single source cell 4 contained in a cylindrical source bore 8, additional source cells 4 may be positioned in a linear arrangement in a single cylindrical source bore 8.

In other embodiments of the device of the invention, the apparatus is not in the form of a single-piece structure, but instead comprises one or more separate structures, wherein each structure contains one of the one or more source cells. Furthermore, the separate structures could be rigidly attached to each other to increase the strength of the apparatus as a whole. The structure could be any type of physical form, such as a tube or a hollow square block, capable of containing one or more source cells. For example, the apparatus could comprise one or more tubes, with each tube containing one of the one or more source cells.

In the embodiment shown in FIG. 16, the first valve 7 includes a plurality of source-cell valves, wherein each source-cell valve is associated with each carrier gas inlet channel 5. That is, each source-cell valve corresponds to a source cell 4 such that the source-cell valve is capable of controlling the flow of the carrier gas into each carrier gas inlet channel 5. By carefully selecting the opening and closing of selected source-cell valves, the device shown in FIG. 16 can be used for the selective patterned deposition of organic vapors, for example, on a substrate.

In the embodiment of the invention shown in FIG. 16, the source cell 4 has a first cylindrical portion having a first radius, while each of the cylindrical source bores 8 has a second radius which is slightly larger than the first radius of the source cell 4. As used herein, the phrase "slightly larger" means allowing for the rotation of the source cells 4 within the cylindrical source bore 8, but impeding the flow of carrier gas therethrough. Also shown in FIG. 16 is a valve 7 including an aperture 9 in the source cell 4 that aligns with the inlet channel 5 when the source cell 4 is in a first position, and does not align with the inlet channel 5 when the source cell 4 is in a second position. By this arrangement, shown in FIG. 16 and described above, each source cell 4 can be turned to an "on" position by rotating the source cell 4 about its own longitudinal axis into the first position, wherein the aperture 9 does align with the inlet channel 5. In this first position, carrier gas can flow through the carrier gas inlet channel 5, the source cell 4, the carrier gas outlet channel 6, the mixing chamber 3 and the nozzle 1. In addition, each source cell 4 can be nearly hermetically sealed in an "off" position by rotating the source cell 4 about its own longitudinal axis into the second position, wherein the aperture 9 does not align with the inlet channel 5, thereby not allowing for the flow of carrier gas through the source cell 4.

Preferably, in the embodiment shown in FIG. 16, the source cell 4 with a first cylindrical portion having a first radius, and each of the cylindrical source bores 8 having a second radius which is slightly larger than the first radius of the source cell 4, are sized and fitted such that hot-valving occurs when using the device. As used herein, the term "hot-valving" refers to the opening and/or closing of a hot, gas-tight seal between a source cell 4 and a cylindrical source bore 8. The hot (preferably in the range of about 150° to about 500° C., more preferably about 215° C.), gas-tight seal is preferred to prevent the undesired passage of carrier gas through the apparatus and out of the nozzle, which could generally not he achieved with the use of lubricants and/or elastomeric seals (such as elastomeric o-rings) which are commonly used in liquid-based systems, such as ink jet printing methods and devices. In addition, known sealants and lubricants for gas-based systems, such as teflon and graphite, can be used in accordance with the invention.

Figure 17:
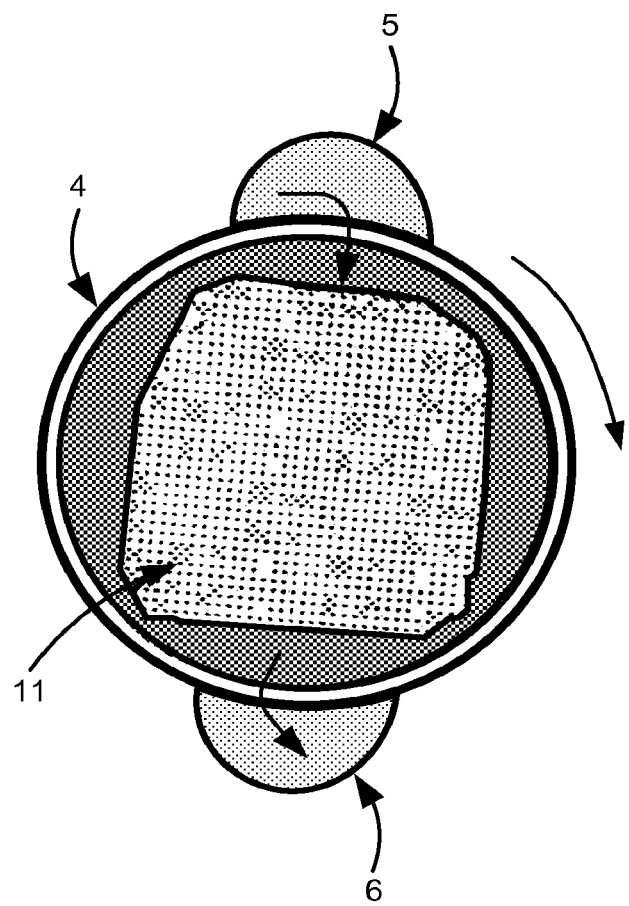
FIG. 17 shows an enlarged cross-sectional view of a source cell shown in FIG. 6.
Figure 18:
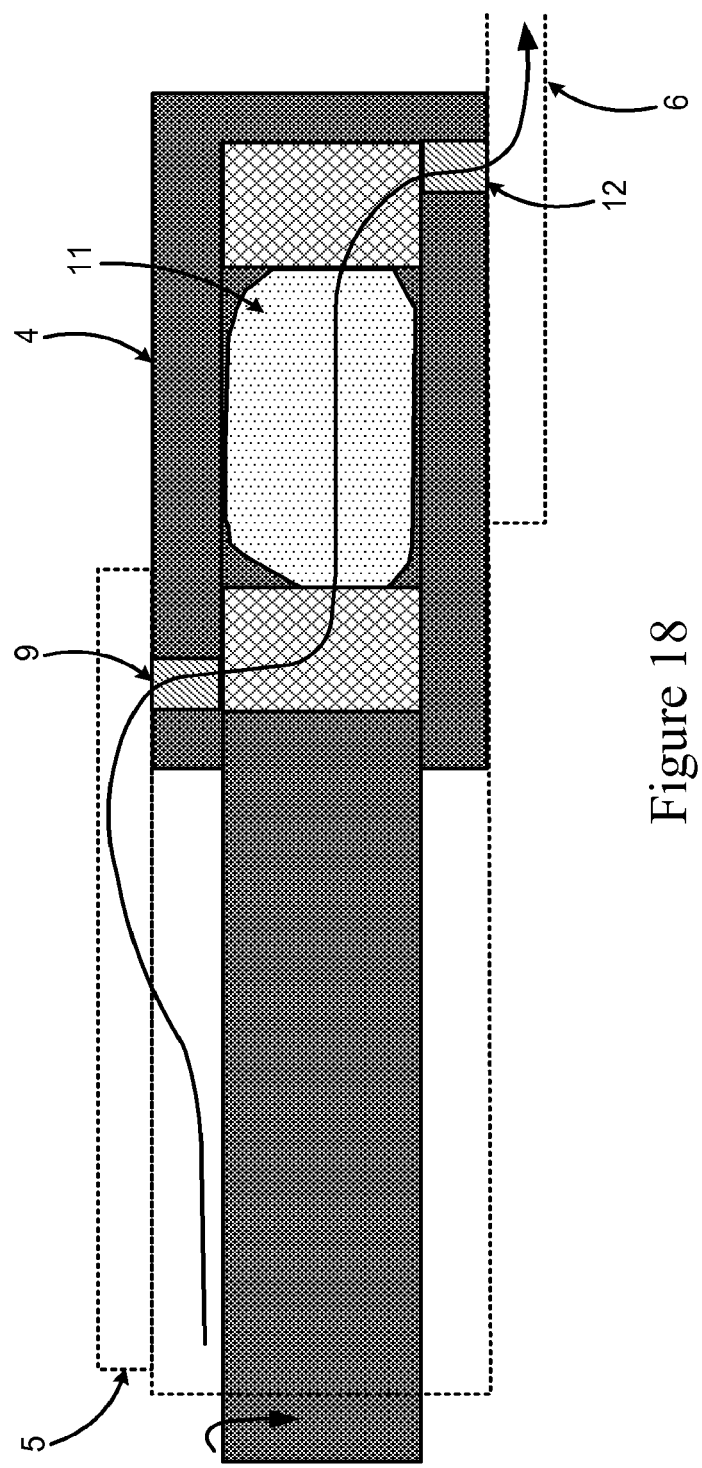
FIG. 18 shows an enlarged side view of a source cell shown in FIG. 16.

FIG. 17 shows an enlarged version of the embodiment of the source cell 4 shown in FIG. 16. The reference numbers in FIGS. 16-20 are consistent throughout and refer to the same device components in each Figure. FIG. 17 shows a cross-sectional view of the source cell 4, while FIG. 18 shows a side view of the source cell 4. As seen in FIGS. 16 and 17, the source cell 4 is in the form of a cylinder, which may be opened for the purpose of cleaning and filling with the organic material 11. The source cell 4 has an inlet aperture 9 and an outlet aperture 1612. As can be seen by the arrow in FIG. 3, the flow of the carrier gas is directed through the inlet channel 5, the inlet aperture 9, the organic material 11, the outlet aperture 12, and the outlet channel 6, the path of which provides for more efficient organic vapor pick-up by the carrier gas.

The preferred temperatures and pressures to be employed in the method and with the device of the present invention are the same as those typically employed in organic vapor phase deposition. That is, preferred operating pressures for the invention range from 0.01 to 10 Torr. In addition, preferred operating temperatures for the invention range from about 150° to about 500° C. This temperature range is preferred because at temperatures below about 150° C. the resulting vapor pressure of the organic material is generally too low to evaporate the organic material and transport it in the vapor phase, while at temperatures above about 500° C. the decomposition of the organic material is a possible result.

In some embodiments, the one or more source cells may be heated to generate the desired vapor pressure of the organic material within the one or more source cells. The heating of the one or more source cells can be accomplished via a heating element and/or an insulating material positioned in any way such that heat reaches the one or more source cells. Such heating elements and insulating materials are known in the art, and are within the scope of the present invention. For example, a separate heating element could be positioned around each individual source cell, or a single heating element could be positioned around the entire apparatus which includes the one or more source cells. Thus, in the embodiment of the device shown in FIG. 16, although not shown, a heating element could be placed around the source cell 4, or a heating element could be placed around the apparatus 2.

In addition, in some embodiments, the temperature of each of the one or more source cells may be controlled as follows. The heating element can generate an axial temperature gradient along the structure which it is surrounding or adjacent to. For example, if the heating element is positioned around the apparatus, such as the cylindrical apparatus 2 shown in FIG. 16, an axial temperature gradient is generated along the cylinder, while the source cell 4 can be pulled out of or pushed into its cylindrical source bore 8 to a desired position corresponding to the desired temperature value. In the embodiment of the device shown in FIG. 16, the range of adjustability is controlled by the temperature gradient along the apparatus 2, the distance between the inlet and outlet orifices of the source cell 4, as well as the distance and stagger between the carrier gas inlet channel 5 and the carrier gas outlet channel 6. In general, the rate of organic vapor delivery is controlled jointly by the source cell temperature, the flow rate of the carrier gas through the source cell 4, and the flow rate of the carrier gas through the dilution channel 10.

Embodiments of the device of the present invention are preferably comprised of a metallic material, including but not limited to, aluminum, stainless steel, titanium, and other alloys. Preferably, the components of the device of the present invention, particularly the source cells and the apparatus in which the source bores contain the source cells, are comprised of materials having a similar coefficient of thermal expansion (i.e., within about 10% of one another), and more preferably, are comprised of the same material. By employing materials in the device with a similar coefficient of thermal expansion, differential expansion upon heating of the source cells and the apparatus in which the source bores contain the source cells is largely avoided. Thus, upon heating the device to the desired temperature, the device will not encounter the potential problems of a source cell expanding in a source bore and "locking-up" therein, or of a gap developing between the source cell and the source cell allowing for the undesired passage of carrier gas therethrough. In addition, the device of the invention can be manufactured by methods known in the art, including but not limited to, casting, forging or machining.

In another embodiment of the invention, the one or more nozzles of the device are comprised of a low-emissivity material. Because the one or more nozzles of the device are preferably within about 1 millimeter from the substrate, when a low-emissivity material, such as a ceramic, is used as the material for the one or more nozzles, it largely avoids the problem of possible evaporation of previously deposited organic layers on the substrate because the low-emissivity material may emit less heat than other materials, thereby lessening the possibility of evaporating such organic layers.

Figure 19:
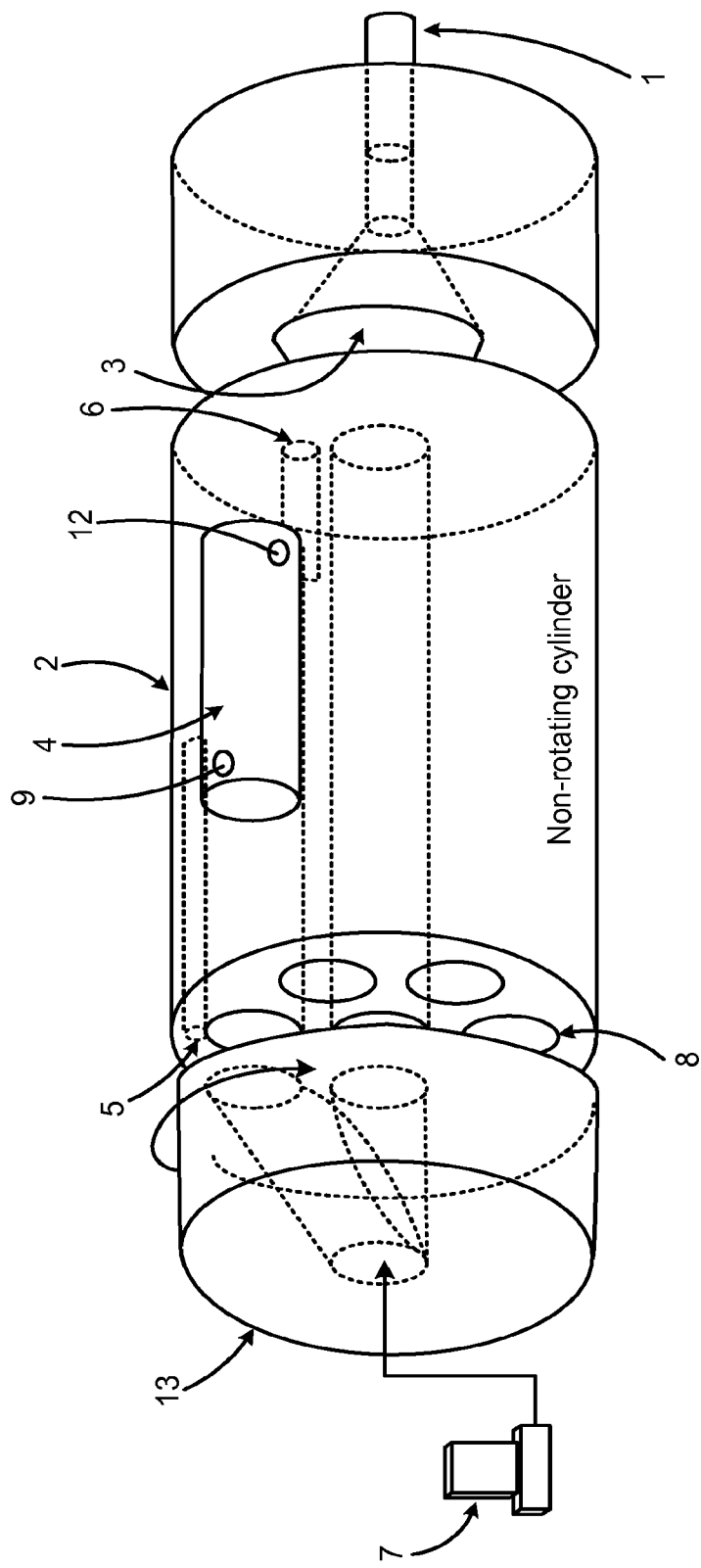
FIG. 19 shows another embodiment of an OVJP apparatus.

In some embodiments, for example as shown in FIG. 19, the device can further include a selector 13 located next to the apparatus 2 which is capable of controlling the flow of carrier gas into each carrier gas inlet channel 5. In FIG. 19, the selector 13 is placed upstream of the apparatus 2, and the selector 13 can rotate rapidly about its own longitudinal axis to selectively direct the flow of the carrier gas into the inlet channels 5 and the cylindrical source bores 8. By carefully selecting the rate at which the selector 13 rotates, the device shown in FIG. 19 can be used for the selective patterned deposition of organic vapors, for example, on a substrate.

Figure 20:
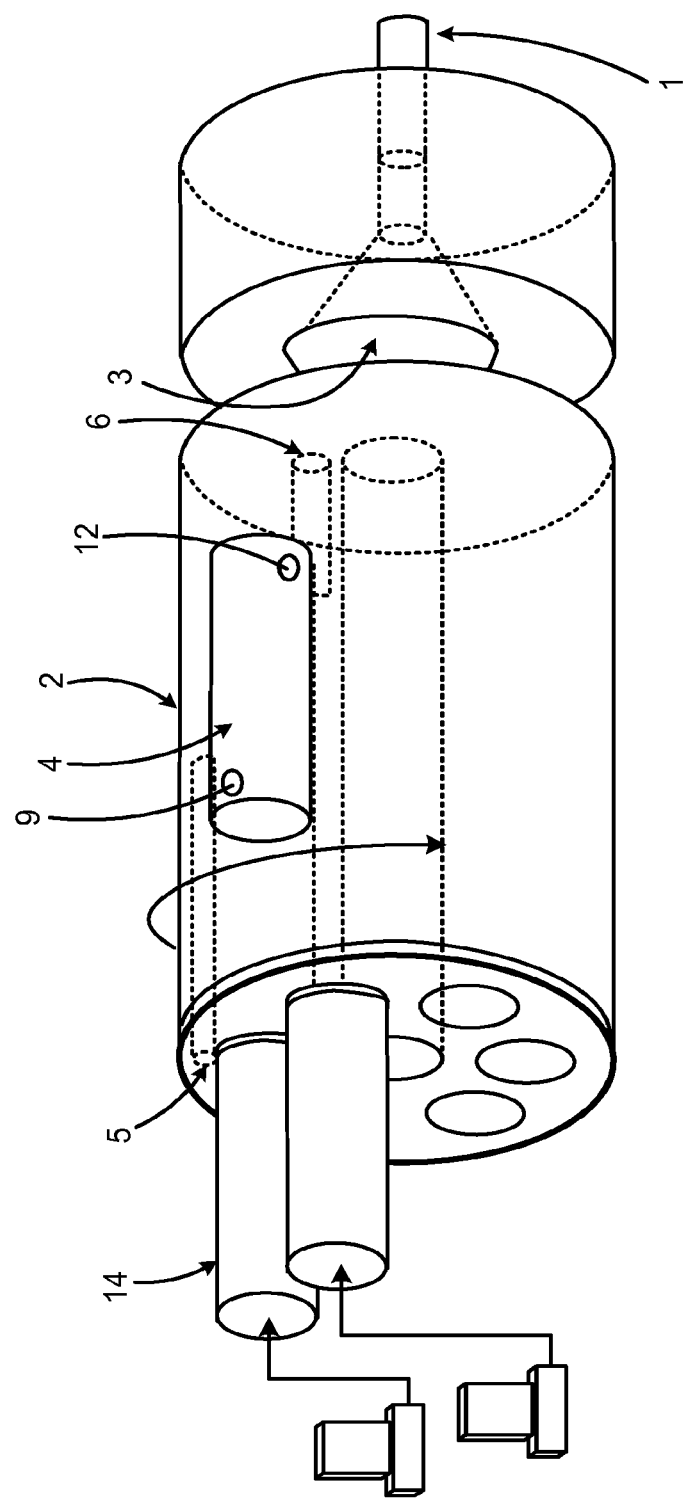
FIG. 20 shows a further embodiment of an OVJP apparatus.

In some embodiments, for example as shown in FIG. 20, the entire apparatus 2 is capable of rotating about its own longitudinal axis. In this embodiment, the flow of carrier gas into each carrier gas inlet channel 5 is controlled by the rotational position of the apparatus 2. For example, in the embodiment shown in FIG. 20, there are two stationary inlet tubes 14 placed upstream of the apparatus 2, which can rotate rapidly about its own longitudinal axis to selectively direct the flow of the carrier gas from the stationary inlet tube 14 into the selected source cell 4. By carefully selecting the rate at which the apparatus 2 rotates, the device shown in FIG. 20 can be used for the selective patterned deposition of organic vapors, for example, on a substrate.

As the device of the invention can include one or more nozzles and one or more source cells, embodiments of the device can include any combination of nozzle and source cell quantities. For example, an embodiment of the device could include one nozzle and three source cells, wherein the three source cells include a first source cell containing a first organic material capable of emitting a blue spectra of light, a second source cell containing a second organic material capable of emitting a green spectra of light, and a third source sell containing a third organic material capable of emitting a red spectra of light. Another embodiment of the device could include an array of nozzles with one or more source cells, while still another embodiment of the invention could include an array of devices, each with one nozzle and a plurality of source cells. All such combinations of nozzle and source cell quantities are within the scope of the device of the present invention.

In an embodiment of the method of the invention, a method of depositing an organic material is provided. The organic material may be deposited, for example, as an amorphous or crystalline film. The method comprises moving a substrate relative to an apparatus integrally connected to one or more nozzles. The apparatus comprises: one or more source cells, each source cell containing an organic material; a carrier gas inlet leading to each source cell; a carrier gas outlet leading from each source cell to one or more nozzles; and a first valve capable of controlling the flow of a carrier gas through the one or more source cells. The method also comprises controlling the composition of the organic material and/or the rate of the organic material which is ejected by the one or more nozzles while moving the substrate relative to the apparatus, resulting in an organic material being deposited over the substrate.

According to this embodiment of the method of the invention, the moving of a substrate relative to an apparatus can be accomplished in more than one way. For example, the substrate can be stationary and the apparatus can be moved in a direction parallel to the plane of the substrate. In addition, the apparatus can be stationary and the substrate can be moved in a direction parallel to the plane of the substrate.

Furthermore, any embodiment of the apparatus or device of the invention can be used in accordance with the method of the invention. For example, the embodiment of the device which includes a selector located next to the apparatus which is capable of controlling the flow of carrier gas into each earner gas inlet channel may be used to control the composition of the organic material and/or the rate of the organic material which is ejected by the apparatus while moving the substrate relative to the apparatus. In addition, the embodiment of the apparatus which is capable of rotating about its own longitudinal axis may be used to control the composition of the organic material and/or the rate of the organic material which is ejected by the apparatus while moving the substrate relative to the apparatus.

Embodiments of the method of the invention can be used to facilitate the rapid deposition and patterning of organic materials on substrates. For example, the phrase "rapid deposition" may refer to the deposition of an entire display (about 3 million pixels) in about 10 seconds. Such rapid deposition can be achieved, for example, by an embodiment of the device of the invention comprising a row of nozzles and a plurality of source cells, wherein the row of nozzles could move across a substrate depositing a different organic layer with each pass over the substrate. For example, after five passes over the substrate, a five-layered OLED would result. Alternatively, the same embodiment of the device could make just one pass over the substrate and still produce a five-layered OLED, whereby the source cells of the device would be switched over each pixel site such that five different layers resulted at each pixel site, provided the device had a sufficient switching time for the source cells (preferably about 10 milliseconds).

Such rapid deposition can be achieved with the device of the invention because of the compactness of the device as compared to previous devices. By positioning the organic material to be transported by the carrier gas very close to the substrate on which it is to be deposited in accordance with the present invention, there is less latency involved in depositing the organic layer as compared to previous configurations with a longer distance between the organic material to be transported and the substrate on which it is to be deposited. This longer distance between the organic material and the substrate which is present in previous configurations needs to be cleared out or flushed of any previous organic material being transported by a carrier gas before a second organic material can be deposited via such a configuration. However, the compactness of the device of the present invention allows the device to be able to rapidly deposit different organic materials with rapid switching between the different source cells containing the different organic materials. Preferably, the source cells containing the organic materials are no greater than about 10 cm from the one or more nozzles of the device, with the one or more nozzles preferably being within about 1 millimeter from the substrate.

Such rapid deposition and patterning includes both single-component and doped organic thin films deposited on a substrate. Applications of such patterned organic materials on a substrate include, but are not limited to, electronic, optoelectronic, and optical device fabrication. Furthermore, the device and method of the present invention are readily adaptable to both large-scale deposition processes, such as the fabrication of wall-sized displays, as well as small-scale deposition processes, such as portable organic vapor jet printers for use in research laboratories and/or private homes.

The present invention will now be described in detail with respect to showing how certain specific representative embodiments thereof can be made, the materials, apparatus and process steps being understood as examples that are intended to be illustrative only. In particular, the invention is not intended to be limited to the methods, materials, conditions, process parameters, apparatus and the like specifically recited herein.

EXPERIMENTAL

Devices were fabricated using an organic vapor jet printer having an appearance similar to device 100 of FIG. 1. The organic vapor jet printer consisted of a stainless steel, 5-source chamber, approximately 40 mm in diameter and 60 mm long, with heated walls. The source cells were 5 mm×10 mm hollow stainless steel cylinders. The source materials were pentacene and tris(8-hydroxyquinoline)-aluminum ($Alq_3$), widely employed in organic TFT and LED work, respectively. Both materials were pre-purified twice by vacuum train sublimation and then loaded into their respective cells, sandwiched between two small quartz wool plugs. Depending upon the particular experiment, one or more of the five source cells may not have been used. Nitrogen was used as the carrier gas. The vapor and nitrogen were forced through a collimating nozzle and onto a cooled substrate, which was mounted on a computer-controlled, motorized xyz-motion stage. The background gas pressure in the deposition chamber was maintained between 0.1 and 1000 Torr by means of a roughing pump and a throttle valve. The deposited patterns were imaged with optical and scanning electron microscopes. The substrates used for the TFT deposition were highly conductive silicon wafers with a 210 nm thick layer of dry thermal $SiO_2$ as a gate dielectric. Prior to deposition of pentacene, the substrates were cleaned and exposed in vacuum to a saturated vapor of octadecyl-trichlorosilane (OTS) for 15 minutes at room temperature. The cleaning procedure consisted of sonication of the $SiO_2$-coated substrates in a soap solution, de-ionized water, acetone, trichloroethylene (twice), acetone (twice), and isopropanol (twice), followed by a 10-minute exposure in a UV-ozone chamber. Gold source and drain contacts were deposited by vacuum thermal evaporation after the printing of pentacene. A Hewlett-Packard Model 4155 parameter analyzer was used to obtain the .current-voltage transfer characteristics of the TFTs, which were tested inside of a metallic isolation box, in the dark, at ambient conditions.

Figure 8:
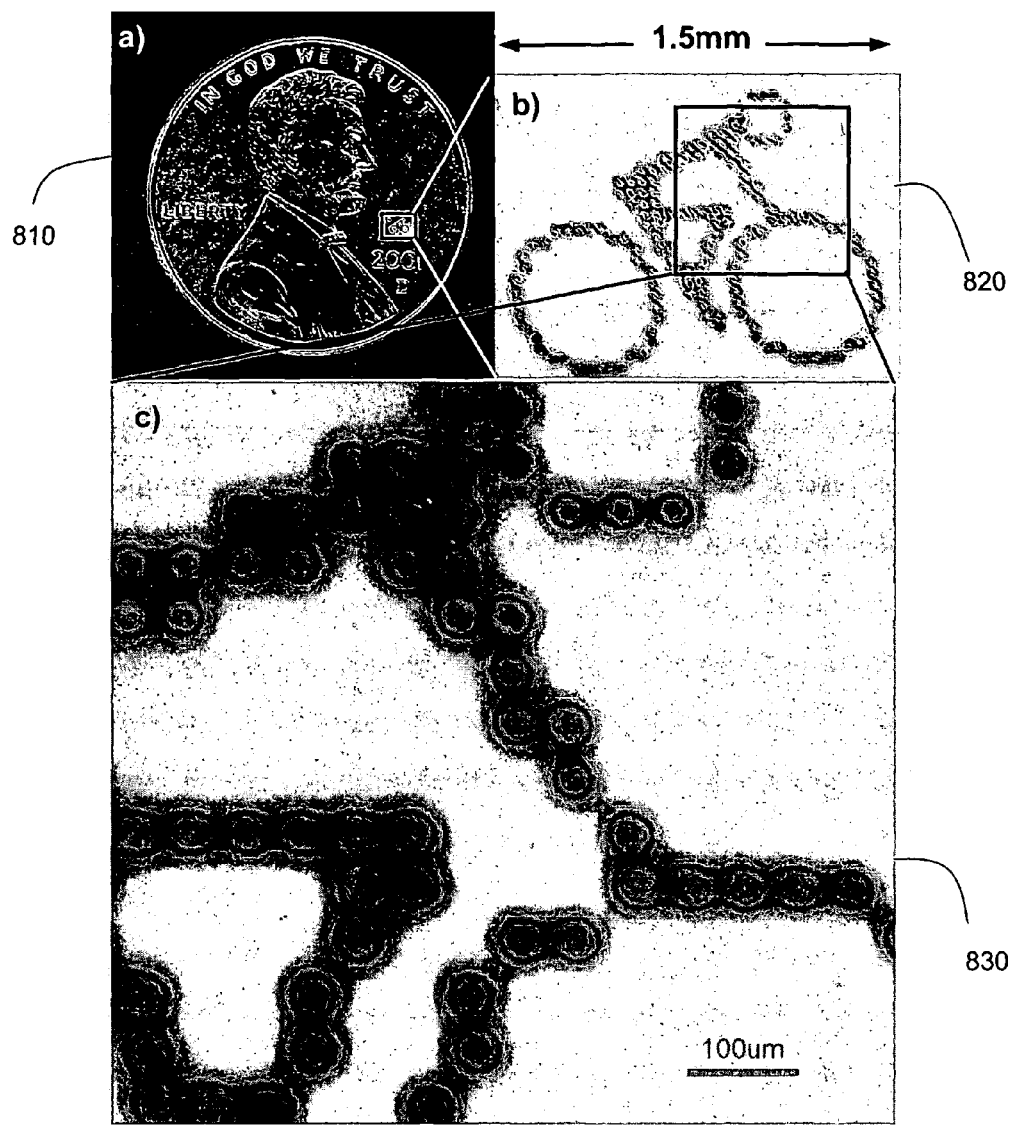
FIG. 8 shows an image printed by OVJP.

FIG. 8 illustrates an image printed by OVJP at several different scales. Image 810 shows the image superimposed on a penny. Image 820 is the image with a 1.5 mm scale line.

Image 830 is the image with a 100 micron scale line. The image was generated by OVJP of $Alq_3$ (flow channel diameter a=20 μm, wall thickness L=100 μm, nozzle to substrate distance s=20±10 μm, a dwell-time of 2 seconds above each pixel location, a movement time between pixels of less than 0.2 sec, upstream pressure 430 Torr, downstream pressure 0.24 Torr, $Alq_3$ source cell temperature=270° C., substrate temperature=15° C., deposition rate approximately $r_{dep}$=1300 Å/s). It is expected that the deposition rate could be increased to over 8000 Å/s by increasing the source temperature to 300° C., without damaging the organic materials. At this growth rate, an array of 800 nozzles can print an SVGA resolution display (600×800 OLED pixels) in under one minute. This speed is comparable to the current state-of-the-art inkjet printers, which also use print heads containing in excess of 500 nozzles. To obtain pixels with flat-top profiles, the nozzle can be rastered or dithered laterally during growth; alternatively, a manifold of closely spaced nozzles can replace the dithered single nozzle.

Figure 9:
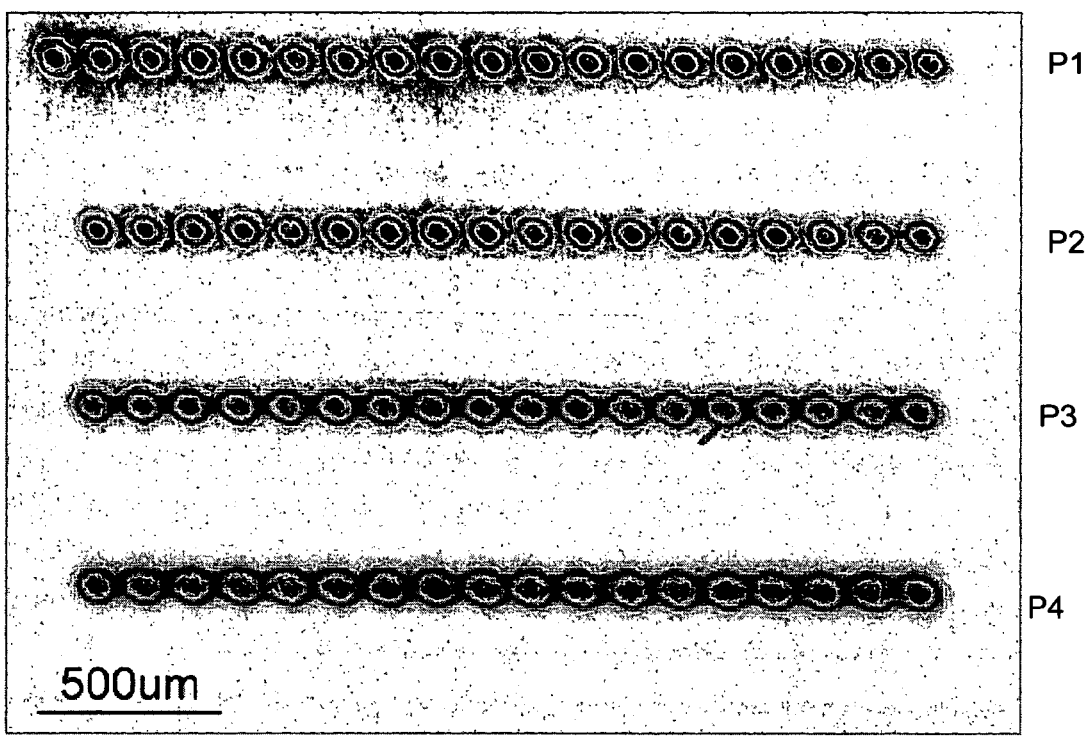
FIG. 9 shows an optical micrograph of pentacene dots printed by OVJP.

FIG. 9 shows an optical micrograph of rows of pentacene dots printed on Si with a 40 μm×250 μm (a×L) nozzle outlet positioned at a distance s=30 μm from the substrate. Interference fringes reflected off of the substrate and deposit surfaces allow the deposition shape to be determined, using known techniques. Each row of dots was deposited at a different chamber pressure ($P_1$=1.33, $P_2$=0.9, $P_3$=0.5, $P_4$=0.17 Torr), while the upstream pressure was maintained constant at Phigh=240 Torr. This combinatorial deposition shows the OVJP regime where pattern resolution can be enhanced by increasing the chamber pressure. This result is somewhat counterintuitive, because one might expect a higher chamber pressure to result in more scattering off of gas molecules in the chamber (for example, as would be expected in OVPD), and thus a decreased resolution at higher chamber pressures. Instead, it has been discovered that a higher chamber pressure may enhance resolution. Without being limited to any theory as to how aspects of the invention work, it is believed that, in the flow regime of OVJP, a higher chamber pressure confines the gas jet.

Based on these results, it is expected that OVJP may be practiced at higher background pressures than one might otherwise believe. In fact, at higher pressures, there is a favorable effect on the shape of the deposition. This favorable affect is visible at a background pressure of 0.1 Torr, and becomes more pronounced at higher pressures such as 1 Torr, 10 Torr and 100 Torr. As demonstrated herein, devices may be fabricated at atmospheric pressure (760 Torr), which may greatly reduce the need for expensive capital equipment for fabricating devices. It is believed that the favorable effect may manifest at background pressures as low as 10 e-3 Torr, but may not be noticeable and as apparent as demonstrated herein. In addition, the higher pressures (0.1 Torr and above) may be achieved with less sophisticated vacuum apparatus, so there is a significant advantage from a cost perspective to operating at a background pressure higher than previously thought possible.

Figure 10:
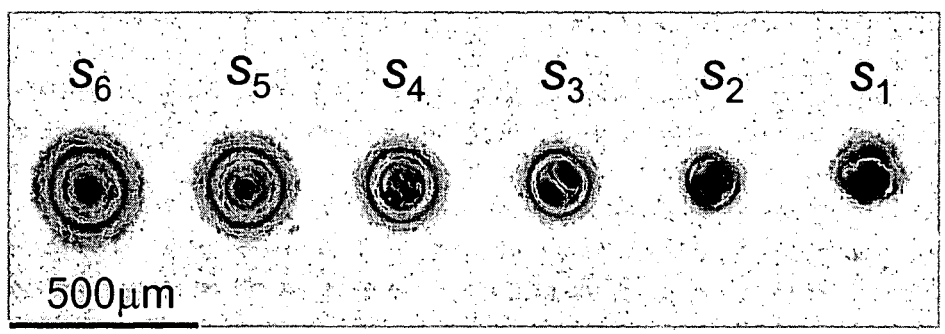
FIG. 10 shows an optical micrograph of $Alq_3$ dots printed by OVJP.

FIG. 10 shows an optical micrograph of tris-(8-hydroxyquinoline)-aluminum ($Alq_3$) dots printed onto Si using a 20 μm×100 μm nozzle, at $P_{high}$=240 Torr and $P_{low}$=0.24 Torr. The distance from the nozzle outlet to the substrate s was varied (25, 53.4, 81.8, 110.2, 138.2, and 167)±10 microns, with S1=25 and S6=167 μm. The dwell time at each dot location was 60 seconds.

Figure 11:
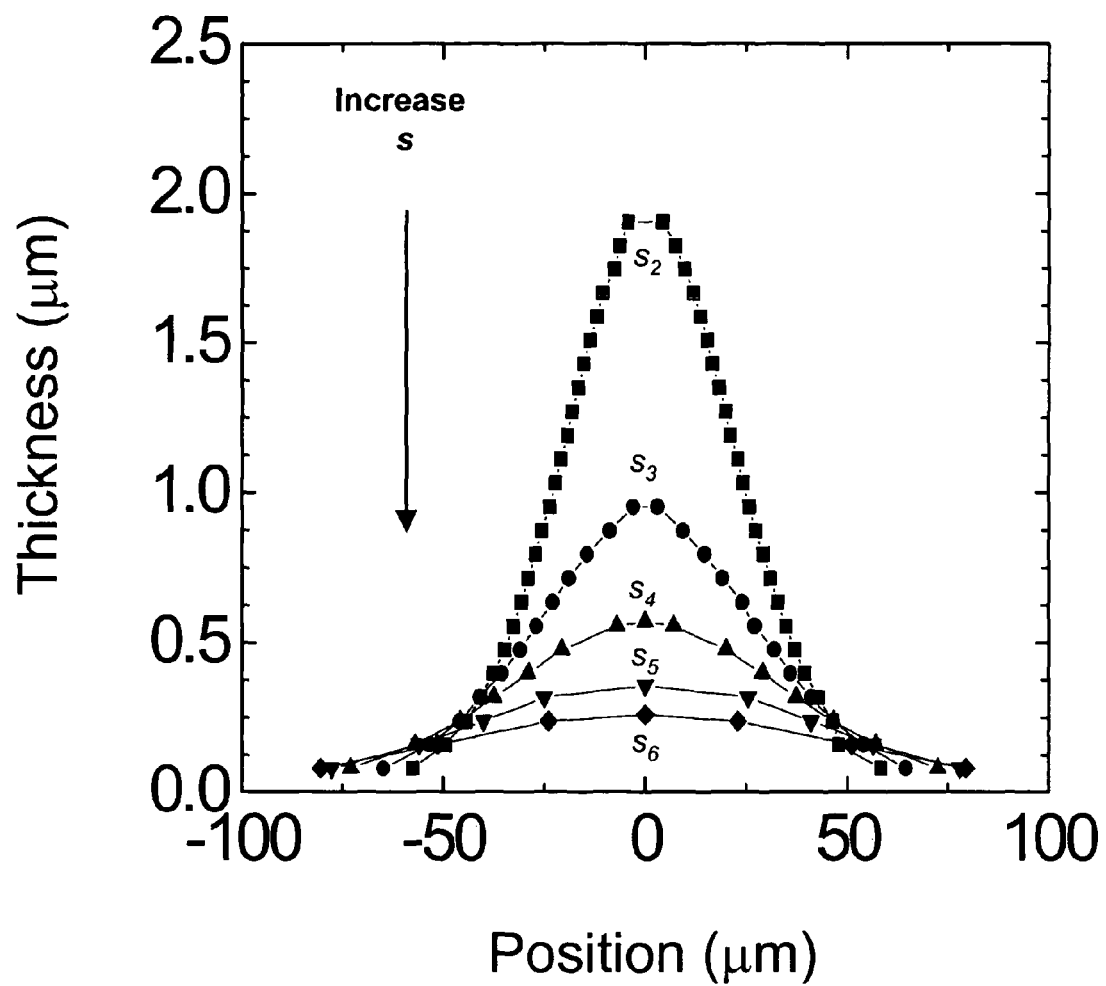
FIG. 11 shows thickness profiles for the dots of FIG. 7.

FIG. 11 shows thickness profiles calculated from the interference fringe patterns of FIG. 10. For sufficiently thick deposits, light-interference fringes allow the deposit profile to be determined.

Figure 12:
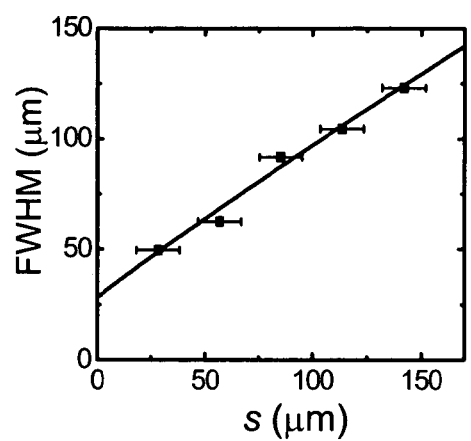
FIG. 12 shows a plot of the full width half maximum of the thickness profiles of FIG. 9 v. the square root of nozzle-substrate separation.

Equation (8) predicts that the pattern dispersion, χ, should scale as $s^{1/2}$. FIG. 12 shows that $(FWHM)^2$ scales linearly with s, in agreement with Eq. (8). The full width-half maximum (FWHM), as taken from the thickness profiles of FIG. 11 after normalization, was used as a measure of χ.

Figure 13:
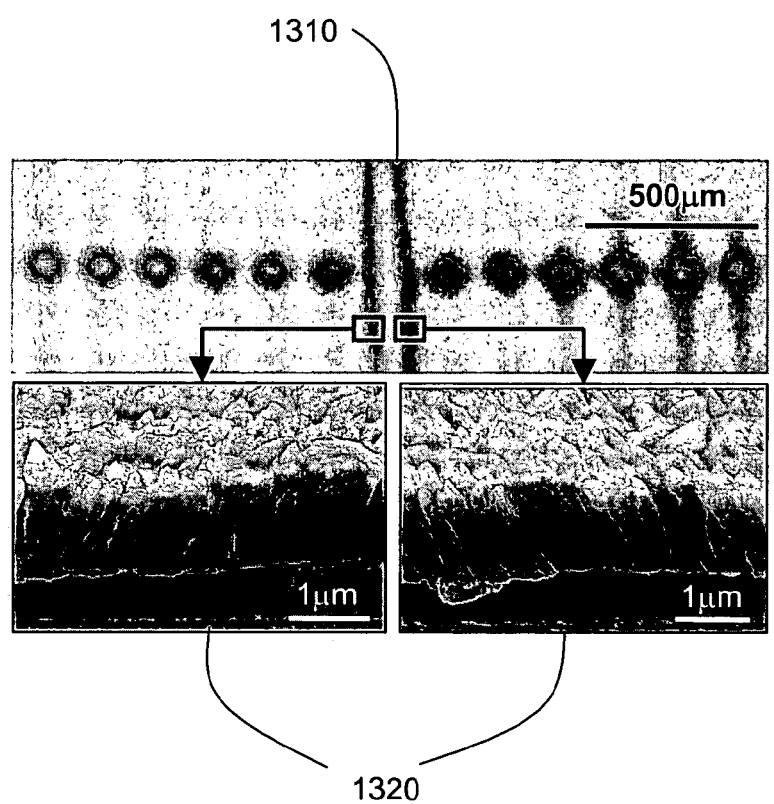
FIG. 13 shows a scanning electron micrograph of a pentacene line deposited by OVJP.

FIG. 13 shows a scanning electron micrograph (SEM) of a pentacene line printed on $SiO_2$ with a local deposition rate>300 Å/s and s=35±15 μm. Image 1310 is the pentacene line with a 500 micron scale line, while images 1320. are the same pentacene line at a higher magnification with a 1 micron scale line. The image reveals that the pentacene grows in the shape of slanted nano-pillars. The nano-pillars situated to the left and the right of the jet center tilt in toward the nozzle, toward the direction from which gas flows. This effect is not observed in diffusion-limited growth, such as occurs in OVPD, but may be caused by the self-shadowing of pentacene crystallites during the highly directional "feed" of the crystals during the OVJP process. This directionality is due to the anisotropic molecular velocity distribution in the gaseous jet. A similar crystal growth mode has been observed during glancing angle deposition of metals. Seeding the organic molecules in a fast-flowing carrier stream also allows near-to hyper-thermal velocities to be reached by the adsorbent and, consequently, the tuning of incident kinetic energy. This decouples the film crystallization dynamics from surface temperature, leading to highly ordered films even for relatively cold substrates. This effect has important implications for improving the performance of devices, such as polycrystalline channel TFTs.

To demonstrate the feasibility of the very high local deposition rates for device application, OVJP was used to print pentacene channel TFTs. The pentacene channel was printed in the form of a 6 mm×6 mm uniformly filled square by rastering the narrow jet over a 5 mm×5 mm substrate area. The TFT channels were defined by the Au drain-source electrodes, which were deposited in vacuum immediately following the printing of pentacene. The printing employed a 350 μm diameter nozzle, with s=1000 μm, $T_{source}$=220° C., $T_{substrate}$=20° C., $Q_{source}$=5 sccm, $Q_{dilution}$=5 sccm, $P_{high}$=20 Torr, and $P_{low}$=0.165 Torr, resulting in a local pentacene growth rate ~700 Å/s.

Figure 14:
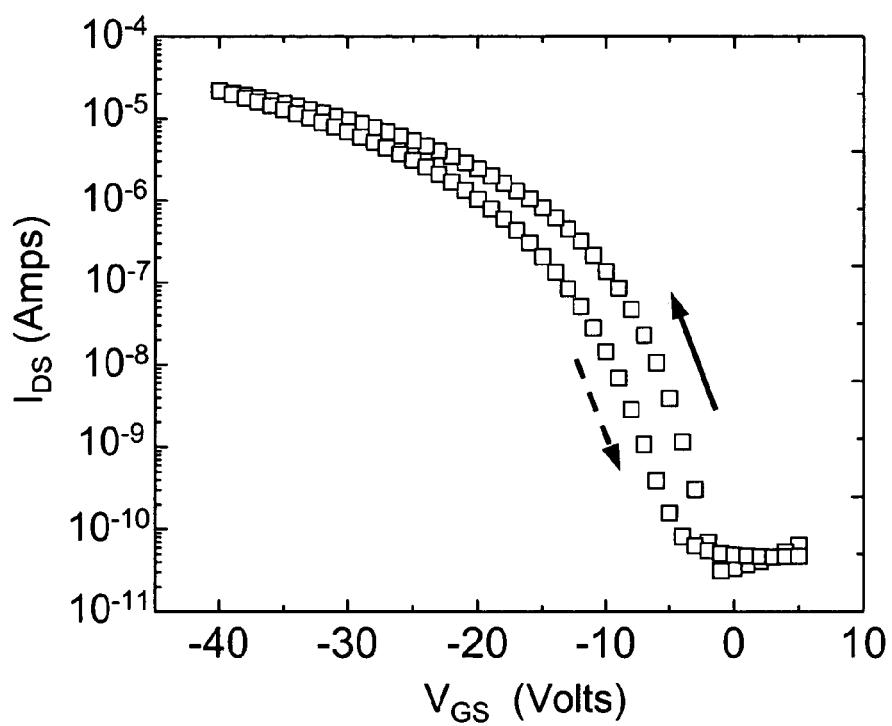
FIG. 14 shows a plot of drain-source current v. drain-source voltage for a TFT deposited by OVJP.
Figure 15:
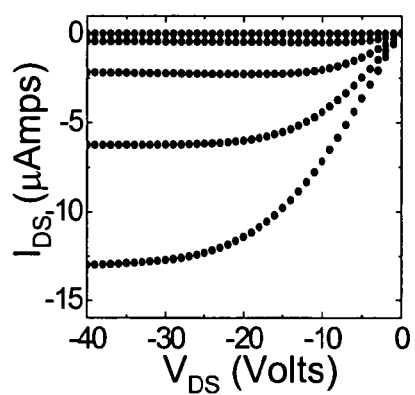
FIG. 15 shows a plot of drain-source current v. gate-source bias for a TFT deposited by OVJP.

The active pentacene channel had a gate width/length ratio of 1000/45 (±5) μm, and consisted of a 5000 Å thick pentacene film with an average grain diameter of <200 nm. The device drain-source current ($I_{DS}$) versus voltage ($V_{DS}$) characteristic is plotted in FIG. 14, showing the drain-source current saturation behavior similar to that previously observed for vacuum and OVPD grown pentacene TFTs. The characteristic was obtained from the drain-source current saturation regime at $V_{DS}$=−40V. The TFT exhibited some hysteresis in the $I_{DS}$ vs. $V_{GS}$ behavior, with the threshold voltage shifting from +10 to +17 V in the forward and reverse $V_{GS}$ directions, as indicated. The $I_{DS}$ vs. the gate bias ($V_{GS}$) is plotted in FIG. 15, revealing an $I_{DS}$ on/off ratio of $7 \cdot 10^5$ and a channel field-effect hole mobility of $\mu_{eff}$=0.25±0.05 cm²/V·s in the saturation regime. The hole mobility of a vacuum-deposited control TFT deposited via thermal evaporation was similar, but, due to thinner pentacene in the channel region, it showed a smaller source-drain off current.

Organic vapor jet printing was also used to print pentacene TFTs in nitrogen at atmospheric pressure; the TFTs exhibited=0.2 cm²/V·s. The hole mobility of a vacuum-deposited control TFT was within the experimental error of the values obtained by OVJP at $P_L$ 0.2 Torr. The cost of device and circuit fabrication can be significantly reduced by the ability to directly print small-molecular organic transistors at ambient conditions, such as in a nitrogen glove box.

The deposition of a working device at atmospheric pressure is particularly significant, because it demonstrates the feasibility of using OVJP without expensive and cumbersome vacuum equipment that requires time to pump down. For example, the ability to deposit at atmospheric pressure may greatly facilitate the deposition of organic materials in a large scale assembly line. It may be desirable to deposit in a controlled atmosphere to avoid impurities, such as in a glove box filled with an inert gas such as nitrogen, but such a controlled atmosphere may be significantly cheaper, easier and faster to provide as compared to a vacuum. Another way to control impurities from an ambient atmosphere is to use a guard flow, such as that produced by the device illustrated in FIG. 2.

EXAMPLES

Example 1

In Example 1, an embodiment of the device of the invention as seen in FIG. 16 was used to deposit an organic material on a silicon substrate. That is, the device included a single source cell 4 containing an organic material, aluminum tris(8-hydroxyquinoline)(Alq$_3$), and a single nozzle 1 with an inner diameter of about 350 μm. In this example, the distance between the end of the nozzle 1 and the substrate was in the range of about 0.5 to about 1.0 mm, the deposition pressure was about 270 mTorr, and the source cell temperature was about 222° C.

Figure 21:
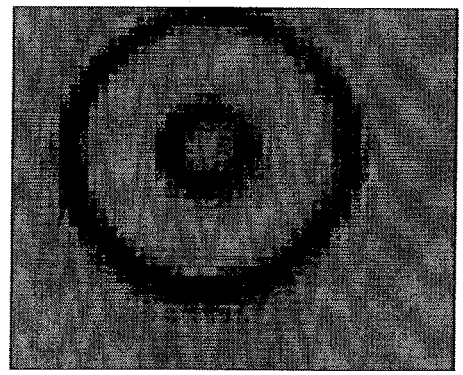
FIG. 21 shows a photograph of the deposited organic material from Example 1 showing interference fringes due to the variation in thickness of the deposited organic material.

FIG. 21 shows a photograph of the deposited Alq$_3$ from Example 1 (from an overhead view looking down on the deposited Alq$_3$) showing interference fringes due to the variation in thickness of the deposited Alq$_3$. The width of the deposited Alq$_3$ shown in FIG. 21 is approximately 500 μm.

Example 2

In Example 2, an embodiment of the device of the invention as seen in FIG. 16 was used to deposit an organic material on a silicon substrate. That is, the device included a single source cell 4 containing an organic material, Alq$_3$, and a single nozzle 1. However, in the embodiment of the device used in Example 2, the nozzle 1 had an inner diameter of approximately 50 μm. In this example, the distance between the end of the nozzle 1 and the substrate was in the range of about 0.5 to about 1.0 mm, the deposition pressure was about 270 mTorr, and the source cell temperature was varied within the range of 209° to 225° C.

Figure 22:
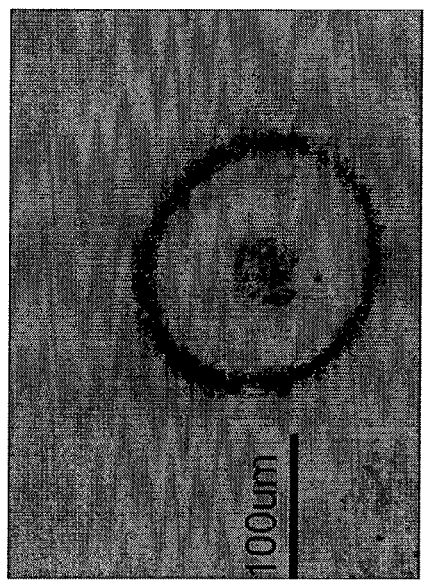
FIG. 22 shows a photograph of the deposited organic material from Example 2 showing interference fringes due to the variation in thickness of the deposited organic material.

FIG. 22 shows a photograph of the deposited Alq$_3$ from Example 2 (from an overhead view looking down on the deposited Alq$_3$) showing interference fringes due to the variation in thickness of the deposited Alq$_3$. The width of the deposited Alq$_3$ shown in FIG. 22 is approximately 100 μm.

Figure 23:
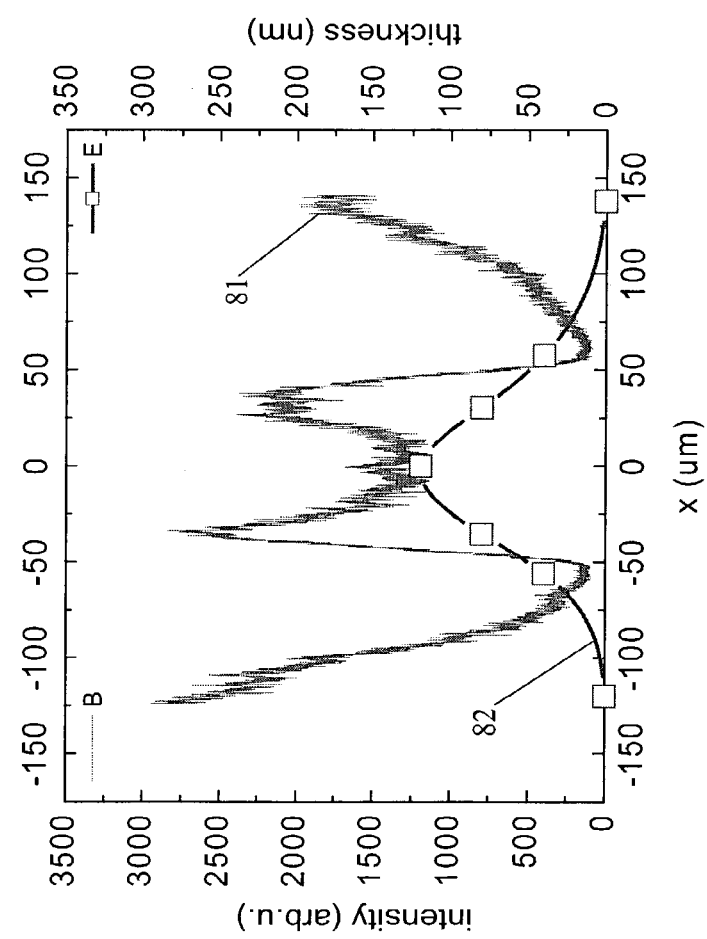
FIG. 23 shows the light intensity profile of the photograph of the deposited organic material from Example 2, and the physical shape of the deposited organic material from Example 2.

The physical shape of the deposited Alq$_3$ from Example 2 is shown in FIG. 23. Curve 81 represents the light intensity profile of the photograph of the deposited Alq$_3$ from Example 2 (which is shown in FIG. 22), graphed as arbitrary units of intensity as a function of x (μm), wherein x represents the distance from the center (O) of the deposited Alq$_3$. The light intensity profile 81 was then translated into curve 82 which represents the physical shape of the deposited Alq$_3$ from Example 2, plotted as thickness (rim) as a function of x (μm). As can be seen in FIG. 23, curve 82 approximates a bell-shaped curve, wherein during deposition the center of the nozzle 1 is located approximately over the center of the deposited organic material, denoted on the x-axis of FIG. 23 by the numeral "0." Thus, in order to flatten-out this bell-shaped curve and deposit an organic material with a flatter profile, the nozzle could be dithered over a desired distance during the deposition process thereby producing a flatter deposited organic material than that shown in FIG. 23. Furthermore, a device of the invention could include more than one nozzle 1 arranged in a linear array with proper spacing between the nozzles such that the hell-shaped deposits from each nozzle 1 would overlap to the extent that the profile of the resulting organic material deposited from the array of nozzles would more closely approximate a plateau rather than a bell-shaped curve.

Example 3

In Example 3, an embodiment of the device of the invention as seen in FIG. 16 was used to deposit an organic material as part of the fabrication of an OLED. The structure of the fabricated OLED 98 can be seen in FIG. 24.

The process used to fabricate the OLED 98 shown in FIG. 24 proceeded as follows. A substrate 91 was comprised of a 12.5 mm×12.5 mm×1 mm glass slide. The substrate 91 was pre-coated with a layer 92 of indium tin oxide (ITO), which served as the anode of the OLED 98 structure. A hole injection layer 93 was deposited onto the ITO-layer 92, wherein the hole injection layer 93 comprised about 100 Å of copper phthalocyanine (CuPc). A hole transporting layer 94 was deposited onto the hole injection layer 93, wherein the hole transporting layer 94 comprised about 450 Å of 4,4'-bis[N-(1-napthyl)-N-phenyl-amino]biphenyl (α-NPD).

Figure 24:
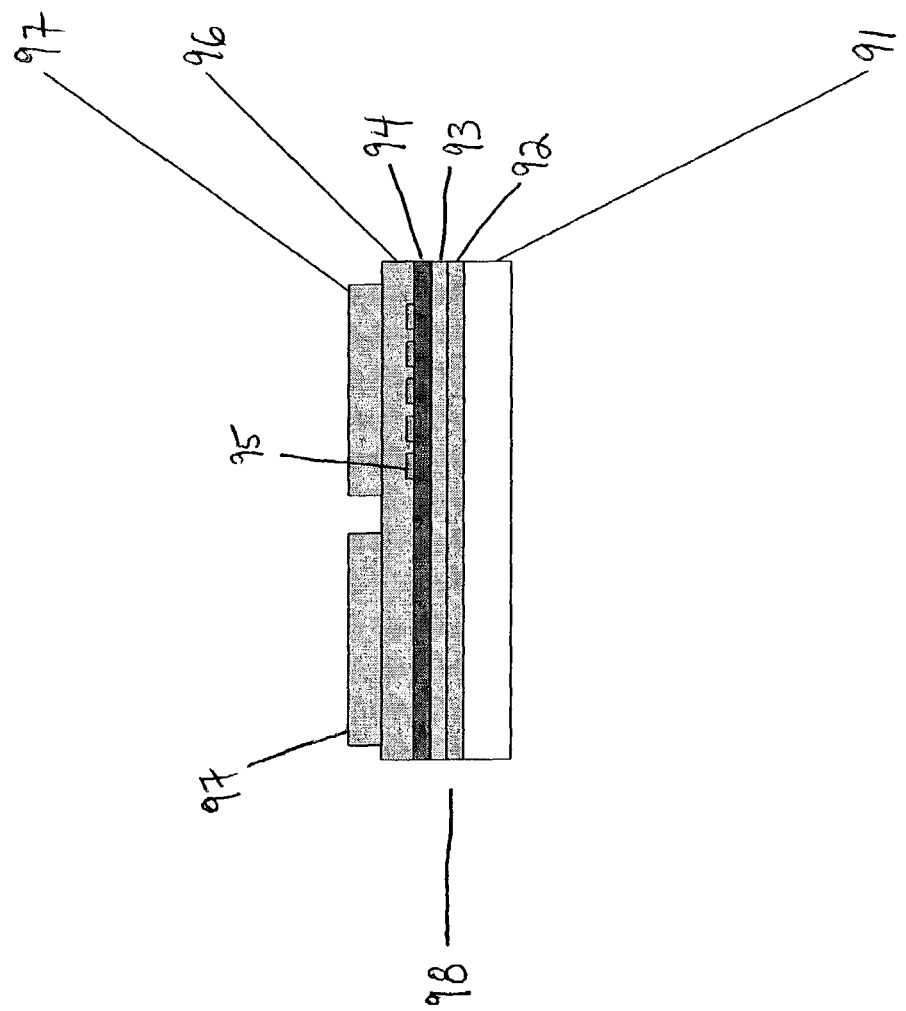
FIG. 24 shows the structure of an OLED fabricated in-part by an embodiment of the device of the invention.

Next, an embodiment of the device of the invention as seen in FIG. 16 was used to deposit dots 95 of the organic material Alq$_3$, a green emitter, onto the hole transporting layer 94, but only on one half of the hole transporting layer 94 as shown in FIG. 24. The deposited dots 95 were each approximately 150 Å thick. The device used to deposit the dots 95 included a single source cell 4 containing the Alq$_3$, and a single nozzle 1 having a length of about 5 mm and an inner diameter of about 50 μm. While depositing the dots 95, the distance between the end of the nozzle 1 and the hole transporting layer 94 was about 200 μm, the deposition pressure was about 275 mTorr, the source cell temperature was about 220° C., and the deposition rate was about 1.25 Å/sec.

An electron transporting layer 96 was then deposited over the dots 95, and over the portions of the hole transporting layer 94 which were not covered by the dots 95. The electron transporting layer 96 comprised about 500 Å of 2,9-dimethyl-4,7-diphenyl-1,10-phenanthroline (BCP). Next, cathodes 97 were deposited over the electron transporting layer 96, one over the half of the OLED 98 containing the dots 95, and one over the other half of the OLED 98. The cathodes 97 each comprised an about 7 Å-thick layer of LiF, capped by an about 1500 Å-thick layer of Al. The depositions of all of the layers of the OLED 98 of Example 3, except for the deposition of the dots 95 as discussed above, were done via high vacuum (~10$^{-6}$ Torr) thermal evaporation.

Figure 25:
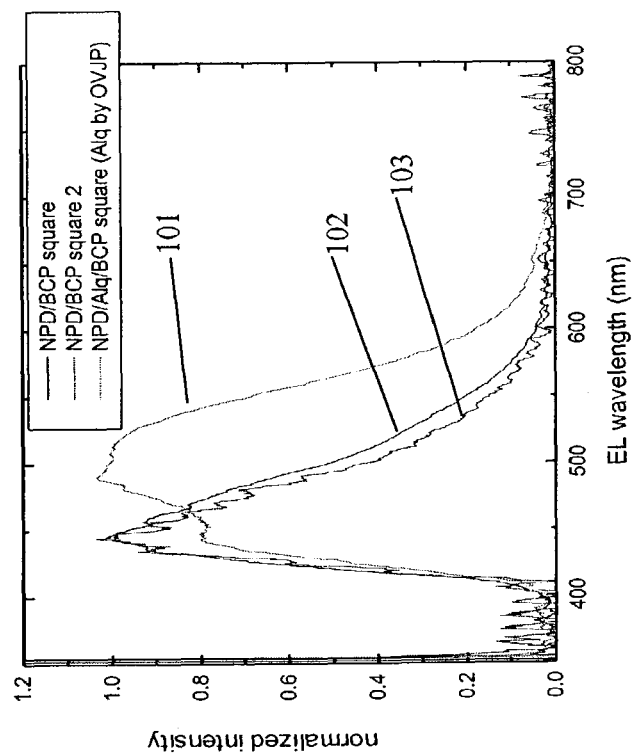
FIG. 25 shows a plot of the electroluminescent (EL) intensity as a function of wavelength for the OLED fabricated in Example 3.

FIG. 25 shows a depiction of the electroluminescent (EL) intensity as a function of wavelength for the OLED 98 fabricated in Example 3. The three different curves shown in FIG. 25 denote different portions of the OLED 98; namely, curve 101 represents that portion of the OLED 98 containing the dots 95, while curves 102 and 103 represent two different locations within that portion of the OLED 98 not containing the dots 95. Thus, the only OLED structural difference represented by these curves 101, 102 and 103 is that curve 101 includes Alq$_3$ dots 95 deposited by an embodiment of the device of the invention as described above. As can be seen in FIG. 25, although all three curves 101, 102 and 103 display a peak EL intensity at about 445 nm, only curve 101 has an additional peak intensity at about 520 nm. This additional peak at about 520 nm shown in curve 101 can be attributed to the green emission of the Alq$_3$ dots 95 which were deposited by the embodiment of the device of the invention as described above.

Although the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method of depositing an organic material, comprising:
    ejecting a carrier gas carrying an organic material from a nozzle at a flow velocity that is at least 10% of the thermal velocity of the carrier gas, to form a layer of organic material on a substrate, the layer comprising a plurality of separate films;
    wherein a dynamic pressure in a region between the nozzle and the substrate surrounding the carrier gas is at least 1 Torr, and
    wherein the plurality of separate films comprises a plurality of pixels.

2. The method of claim 1, wherein the dynamic pressure is at least 10 Torr.

3. The method of claim 2, wherein a background pressure is provided of at least about 5 Torr.

4. The method of claim 2, further comprising:
    providing a guard flow surrounding the organic material ejected from the nozzle.

5. The method of claim 4, wherein a background pressure is ambient atmosphere at about 760 Torr.

6. The method of claim 2, wherein the dynamic pressure of at least 10 Torr is affected by a guard flow ejected from the nozzle.

7. The method of claim 6, wherein a background pressure is provided as the base pressure of a vacuum chamber, and is less than about 0.1 Torr.

8. The method of claim 7, wherein the molecular weight of the organic material is greater than the molecular weight of the carrier gas.

9. The method of claim 6, wherein the guard flow comprises a first gas, the carrier gas comprises a second gas, and the molecular weight of the first gas is greater than the molecular weight of the second gas.

10. The method of claim 1, wherein the dynamic pressure is at least about 760 Torr.

11. The method of claim 1, wherein the dynamic pressure is not greater than about 2 times a background pressure.

12. The method of claim 1, wherein the dynamic pressure is not greater than about 10 times a background pressure.

13. The method of claim 1, wherein at least one of the nozzle diameter, the nozzle length, and the nozzle-to-substrate separation is about equal to the gas mean free path length.

14. The method of claim 1, wherein the dynamic pressure is at least 0. 5 Torr greater than a background pressure.

* * * * *